(12) United States Patent
Nishitani et al.

(10) Patent No.: US 6,906,346 B2
(45) Date of Patent: Jun. 14, 2005

(54) SEMICONDUCTOR DEVICE, LIQUID CRYSTAL DISPLAY DEVICE, EL DISPLAY DEVICE, METHOD FOR FABRICATING SEMICONDUCTOR THIN FILM, AND METHOD FOR MANUFACTURING THE SEMICONDUCTOR DEVICE

(75) Inventors: Hikaru Nishitani, Nara (JP); Makoto Yamamoto, Takarazuka (JP); Yoshinao Taketomi, San Diego, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 200 days.

(21) Appl. No.: 10/333,793

(22) PCT Filed: Jul. 24, 2001

(86) PCT No.: PCT/JP01/06365

§ 371 (c)(1),
(2), (4) Date: Apr. 21, 2003

(87) PCT Pub. No.: WO02/09192

PCT Pub. Date: Jan. 31, 2002

(65) Prior Publication Data

US 2004/0248386 A1 Dec. 9, 2004

(30) Foreign Application Priority Data

Jul. 24, 2000 (JP) ........................................ 2000-222275
Oct. 23, 2000 (JP) ........................................ 2000-322301

(51) Int. Cl.⁷ ........................ H01L 27/108; H01L 29/04; H01L 31/036
(52) U.S. Cl. ........................ 257/70; 257/75; 257/347; 438/166; 438/486; 438/487
(58) Field of Search .............................. 257/66, 69, 70, 257/75, 347; 438/142, 166, 479, 486, 487, 489

(56) References Cited

U.S. PATENT DOCUMENTS

| | | | |
|---|---|---|---|
| 5,663,579 A | | 9/1997 | Noguchi |
| 5,851,862 A | | 12/1998 | Ohtani et al. |
| 6,117,752 A | * | 9/2000 | Suzuki ........................ 438/487 |

FOREIGN PATENT DOCUMENTS

| | | |
|---|---|---|
| JP | 62-193178 A | 8/1987 |
| JP | 3-116924 | 5/1991 |
| JP | 3-292721 A | 12/1991 |
| JP | 5-21343 A | 1/1993 |
| JP | 5-326402 A | 12/1993 |
| JP | 6-151305 A | 5/1994 |
| JP | 6-163590 A | 6/1994 |
| JP | 7-86604 A | 3/1995 |
| JP | 11-64883 A | 3/1999 |
| JP | 11-274502 A | 10/1999 |
| JP | 2000-82669 A | 3/2000 |

* cited by examiner

*Primary Examiner*—Asok Kumar Sarkar
(74) *Attorney, Agent, or Firm*—McDermott Will & Emery LLP

(57) ABSTRACT

This invention concerns with a semiconductor device which is characterized in that the device is provided with a thin film transistor 40 having a polycrystalline semiconductor layer 11, the semiconductor layer 11 including a channel area 22, highly doped drain areas 24, 17 positioned on both sides of the channel area 22 and LDD areas 18a, 18b positioned between the channel area 22 and the highly doped drain areas 24, 17 and lower in dopant density than the highly doped drain areas 24, 17, wherein any diameter of the crystal 14 at least partly existing in the LDD area 18b is larger than the size of other crystals 15.

12 Claims, 27 Drawing Sheets

(a)

(b)

(a)

(b)

(a)

(b)

(c)

(a)

(b)

(a)

(b)

(a)

(b)

POSITION (a)

(b)

(a)

(b)

(a)

(b)

(c)

(d)

(a)

(b)

| CONTROL OF CRYSTAL POS | SIZE OF SILICON CRYSTAL (μm) | LDD (%) RELIABILITY | OFFSET (%) RELIABILITY |
|---|---|---|---|
| NON-CONTROLLED | 0.1 | 50 | 40 |
| NON-CONTROLLED | 0.2 | 57 | 48 |
| CONTROLLED | 0.6 | 81 | 75 |
| CONTROLLED | 0.8 | 90 | 87 |
| CONTROLLED | 1 | 95 | 94 |
| CONTROLLED | 1.6 | 95 | 95 |
| CONTROLLED | 2 | 96 | 96 |
| CONTROLLED | 4 | 97 | 97 |

SEMICONDUCTOR DEVICE, LIQUID CRYSTAL DISPLAY DEVICE, EL DISPLAY DEVICE, METHOD FOR FABRICATING SEMICONDUCTOR THIN FILM, AND METHOD FOR MANUFACTURING THE SEMICONDUCTOR DEVICE

FIELD OF THE INVENTION

The present invention relates to a semiconductor device, a liquid crystal display device, an EL display device, a method for fabricating a semiconductor thin film and a method for manufacturing the semiconductor device.

BACKGROUND ART

A laser anneal method is generally known as a method of producing a semiconductor thin film for forming a semiconductor layer of a thin film transistor (hereinafter referred to as "TFT"). The laser anneal method comprises the steps of forming an amorphous semiconductor film or a microcrystalline semiconductor film on a substrate made of glass or the like, and irradiating the film with laser beams for crystallization to give a polycrystalline semiconductor film. Usually this method is called a crystallization process.

Argon laser, KrF and XeCl excimer laser are generally used as a light source for laser beams to be employed in the crystallization process. The TFT produced by the foregoing method is generally called a low-temperature poly Si-TFT since Si is mainly used as a semiconductor and the process is performed at a temperature below the melting point of glass used as the substrate.

Conventional TFT liquid crystal display devices generally include a TFT having a semiconductor layer formed of amorphous silicon, and is provided with a circuit member for driving the pixels which is of the type having IC chips fixed to the periphery of an image plane. On the other hand, even a driving circuit can be produced by use of the low-temperature poly Si-TFT using a TFT formed on a glass substrate. That is, a region outside an image plane can be reduced at an outer periphery of a panel of a liquid crystal display device which is generally called a picture frame and a more elaborate dot-pitch liquid crystal display device can be produced. Various kinds of semiconductor circuits can be formed on a glass substrate by use of a low-temperature poly Si-TFT having improved performance. That is, the so-called system-on-panel (SOP) can be realized. Moreover, with use of a low-temperature poly Si-TFT, an EL display device can be produced by switching an EL display element.

However, the low-temperature poly Si-TFt poses the following problems.

(1) The crystals in a polycrystalline silicon thin film thus formed have a small size so that due to low mobility of electron, response capability and the like are deteriorated in producing a TFT.

(2) In a TFT, numerous grain boundaries of silicon crystals may be present in a boundary between a lightly doped drain area (hereinafter referred to as "LDD area") or an offset area and a channel area or in its vicinity. In this case, a large number of crystalline defects and dangling bonds exist in the vicinity of the grain boundary so that the performance is deteriorated when the TFT Is allowed to execute a switching operation continuously for a long time or repeatedly many times, resulting in impairment of reliability.

(3) In producing a TFT or a display device, no means is available for determining the positional relationship between the crystals of silicon thin film and TFT pattern, so that it is impossible to determine the position of grain boundary of silicon crystal with respect to the TFT. This results in irregularities of performance in producing a TFT.

DISCLOSURE OF THE INVENTION

A main object of the present invention is to provide a polycrystalline semiconductor thin film having a crystal of large size.

Another main object of the invention is to provide a semiconductor device having a superior performance and high reliability.

(Method of Producing a Semiconductor Thin Film)

To achieve the foregoing objects, a method of producing a semiconductor thin film according to the invention is characterized by comprising the steps of forming a heat-dissipating layer from a material higher in heat conductivity than the semiconductor thin film on a part of an amorphous or polycrystalline semiconductor thin film formed on a substrate, and irradiating the semiconductor thin film with high-intensity light rays or laser beams to achieve crystallization.

According to this method of producing a semiconductor thin film, when the semiconductor thin film is melted by irradiation of intensive light such as flash lamp or laser beams, heat is dissipated by the heat-dissipating layer in the vicinity of the heat-dissipating layer in the semiconductor thin film, whereby the vicinity thereof is quickly cooled. The cooling rate is reduced as the heated part is far and far from the heat-dissipating layer. As a result, a temperature gradient is established in the semiconductor thin film when it is cooled so that the crystal grows along the temperature gradient, i.e. along a direction in which the heated part is more and more away from the vicinity of the heat-dissipating layer, whereby a large size crystal is formed. A TFT produced from the semiconductor thin film thus obtained is improved in mobility because of a crystal of larger size than conventional crystal, whereby the degradation of performance is alleviated.

Preferred specific examples of the procedure of forming a heat-dissipating layer are as follows.

A procedure comprising the steps of forming on the semiconductor thin film a film from a material higher in heat conductivity than the semiconductor thin film; forming a resist mask by photolithography on the film made of a material higher in heat conductivity; removing a part not covered with the resist mask from the film made of a material higher in heat conductivity by an etching technique; and peeling the resist mask.

A procedure comprising the steps of forming a resist pattern by photolithography; forming a film from a material higher in heat conductivity than the semiconductor thin film; and lifting off the resist pattern together with the film made of a material higher in heat conductivity.

A procedure of forming a film from a material higher in heat conductivity than the semiconductor thin film by vapor deposition or sputtering using a mask having openings.

In any of these procedures, the heat-dissipating layer can be easily formed, resulting in an increase of productivity.

The heat-dissipating layer can be formed at a position in contact with the semiconductor thin film and may be positioned on or under the semiconductor thin film.

Another method of producing a semiconductor thin film according to the invention is characterized by comprising the step of irradiating the thin film with high-intensity light rays or laser beams at one or more pulses over a specified range of the substrate in a fixed state of positional relationship between the substrate and a light source. In the case of scanning irradiation wherein pulse irradiation is executed while the substrate or a light source is moved at a specified pitch, the crystal grows correspondingly to the irradiation position, so that the crystal having a greater size than the pitch width in the scanning direction will not grow. On the other hand, the crystal can grow to a large size irrespectively of scanning pitch width by pulse irradiation in a fixed state of positional relationship between the substrate and the light source. Irradiation is executed at a plurality of pulses over a specified range of the substrate, whereby the irregularity of irradiation intensity at each pulse is levelled, and the crystalline size and film quality of the semiconductor thin film are made uniform, so that the irregularity in the performance of TFT produced can be diminished.

High-intensity light rays or laser beams can be supplied with a pulse laser device by scanning irradiation in which irradiation is performed at a plurality of pulses over a specified range of substrate while relatively changing the positional relationship between the substrate and the light source at a specified pitch.

A further method of producing a semiconductor thin film according to the invention is characterized by comprising the steps of forming a heat-dissipating layer on a part of a substrate, forming an amorphous or polycrystalline semiconductor thin film on the substrate, and applying high-intensity light rays or laser beams to the semiconductor thin film to achieve crystallization, wherein the heat-dissipating layer is made of a material higher in heat conductivity than the semiconductor thin film.

According to this method of producing a semiconductor thin film, the semiconductor thin film is formed after forming the heat-dissipating layer, that is, the heat-dissipating layer is formed under the semiconductor thin film, so that the heat-dissipating layer need not be removed in producing a TFT using the semiconductor thin film. Since the removal of heat-dissipating layer can be saved, the heat-dissipating layer can be used as the alignment key in the course of producing a TFT. Examples of the procedure of forming the heat-dissipating layer under the semiconductor thin film include the following.

A procedure comprising the steps of forming a heat-dissipating layer on a substrate; forming an undercoat film having insulating properties over the substrate in a manner to cover the heat-dissipating layer with the undercoat film; and forming an amorphous or polycrystalline semiconductor thin film on the undercoat film, A procedure comprising the steps of forming an undercoat film having insulating properties on a substrate; forming the heat-dissipating layer on the undercoat film; forming another undercoat film having insulating properties over the undercoat film in a manner to cover the heat-dissipating layer with the other undercoat film; and forming an amorphous or polycrystalline semiconductor thin film on the other undercoat film.

A still further method of producing a semiconductor thin film according to the invention is characterized by comprising the step of applying high-intensity light rays or laser beams to an amorphous or polycrystalline semiconductor thin film formed on a substrate via an exposure mask to achieve crystallization, wherein the exposure mask includes a lens member having a curved surface on least one of the top and underside surfaces to give rise to an inclining distribution of light quantity applied to the semiconductor thin film.

According to this method of producing a semiconductor thin film, light-intensity light rays or laser beams are penetrated through the lens member of the exposure mask, whereby an inclining distribution of light quantity applied to the semiconductor thin film is established and a temperature distribution is given to the semiconductor thin film according to the distribution of light quantity. Thereby the molten semiconductor thin film initiates solidification and crystallization at a portion having the lowest temperature, i.e. at a portion having the smallest irradiated light quantity. The crystal grows toward a portion involving a large quantity of irradiated light along an inclining temperature gradient, finally developing into a crystal of large size. When a TFT is produced using this semiconductor thin film, the mobility is increased and the degradation of performance is attenuated because of larger size crystal than conventional crystals.

Preferred specific examples of the method of giving rise to the foregoing distribution of light quantity include the following.

Using an exposure mask having a lens member in the form of a strip or a circle in a plan view, a distribution of light quantity is established in a lengthwise direction of the strip or a diameter direction of the circle.

When the lens member takes the form of a strip in a plan view, the crystal grows from a portion involving a small light quantity to a portion involving a large light quantity along a lengthwise direction of the strip. When the lens member takes the form of a circle in a plan view, the crystal grows in a direction from the vicinity of the center of the lens member to the periphery thereof from a small light quantity to a large light quantity in a direction from the vicinity of center of the lens member to the periphery thereof. When the lens member takes the form of a circle in a plan view, the crystallization is initiated at a point, i.e., a definite position, so that the position of a large size crystal being formed can be advantageously controlled with a high accuracy. Specific examples of the lens member in the form of a circle in a plan view include a concave lens wherein the internal wall surface of a concave portion formed at an underside surface of the exposure mask is substantially spherical.

The curved surface of the lens member is preferably formed by depressing at least a part of the top and underside surfaces of the exposure mask, or may be formed by forming the lens member in a convex form in such manner that the convex part is given a greater thickness than other parts of the lens member.

An additional method of producing a semiconductor thin film according to the invention is characterized by comprising the step of irradiating an amorphous or polycrystalline semiconductor thin film formed on a substrate with high-intensity light rays or laser beams via an exposure mask to achieve crystallization, wherein the exposure mask is so configured that an inclining distribution of light quantity applied to the semiconductor thin film is brought about by giving a phase distribution to the irradiated light quantity.

According to the above-described method of producing a semiconductor thin film, the inclining distribution of light quantity irradiated to the semiconductor thin film is established due to interference of light resulting from the phase distribution so that a temperature distribution is set up in the semiconductor thin film according to the distribution of light quantity. Thereby the molten semiconductor thin film initiates solidification and crystallization at a portion involving the lowest temperature, i.e., a portion involving the smallest irradiated light quantity. Then the crystal grows toward a portion involving a large light quantity along an inclining temperature gradient, finally developing into a crystal having a large size. In producing a TFT using this semiconductor thin film, the mobility is increased and the degradation of performance is decreased due to the larger size crystal than conventional crystals.

Preferred examples of the method of establishing the foregoing phase distribution include the following which facilitate establishing a distribution of light quantity.

Using an exposure mask made of a light transmitting material which is partly different in thickness, a phase distribution is given to the irradiated light rays according to the thickness distribution.

For example, a level difference is made by forming a concave portion of cylindrical shape on an internal wall of an underside surface of the exposure mask, whereby a phase distribution can be given to the irradiated light. When a concave portion is made in a circular form in a plan view, the starting position of crystallization is definite as a point so that advantageously the position of a large size crystal being formed can be precisely controlled.

Another method of producing a semiconductor thin film according to the invention is characterized by comprising the step of applying high-intensity light rays or laser beams to an amorphous or polycrystalline semiconductor thin film formed on a substrate via an exposure mask to achieve crystallization, wherein the exposure mask is formed of a light-intercepting material and has a plurality of openings by which an inclining distribution of light quantity applied to the semiconductor thin film is established.

According to this method of producing a semiconductor thin film, an inclining distribution of light quantity applied to the semiconductor thin film is established by suitably determining the size, shape and arrangement of openings so that a temperature distribution is brought about in respect of the semiconductor thin film according to the distribution of light quantity. Thereby the molten semiconductor thin film initiates solidification and crystallization at a portion of the film involving the lowest temperature, i.e., a portion involving the smallest irradiated light quantity. Then the crystal grows along an inclining temperature gradient toward a portion involving a large quantity of irradiated light, finally developing into a crystal having a large size. In producing a TFT using this semiconductor thin film, the mobility is improved and the degradation of performance is mitigated due to the larger size crystal than conventional crystals.

Preferred specific examples of the method of giving rise to the distribution of light quantity include the following.

The foregoing distribution of light quantity is established along a lengthwise direction of the strip area using an exposure mask having a plurality of openings such that a rate of openings per area unit is stepwise or continuously varied along a lengthwise direction of the strip area.

The foregoing distribution of light quantity is established along a diameter direction of the circular area using an exposure mask having a plurality of openings such that a rate of openings per area unit is stepwise or continuously increased along a diameter direction from the center of the circular area to the periphery thereof.

When a rate of openings per area unit is varied along a lengthwise direction of the strip area, the crystal grows from a portion involving a small light quantity along a lengthwise direction toward a portion involving a large light quantity. When the rate of hole area per area unit is increased from the center of the circular area to the periphery thereof in a diameter direction, the crystal grows from the center of the circular area to the periphery thereof. When the distribution of light quantity makes an inclining change, the crystal grows to a larger size. In the latter case, since the crystallization is initiated at a definite position, i.e., a point, the position of a large size crystal being formed can be advantageously controlled with a high accuracy.

In the method of producing a semiconductor thin film, a semiconductor thin film may be formed after forming a porous insulating film on a substrate, whereby the crystal of larger size can be obtained.

(Method of Producing a Semiconductor Device)

To achieve the foregoing objects, a method of producing a semiconductor device according to the invention is characterized by comprising the steps of forming a heat-dissipating layer and an alignment key on a part of an amorphous or polycrystalline semiconductor thin film formed on a substrate, the heat-dissipating layer being made of a material higher in heat conductivity than the semiconductor thin film, irradiating the semiconductor thin film with high-intensity light rays or laser beams for crystallization, and forming a gate electrode film on the semiconductor thin film, wherein the alignment key is used at least in a photo procedure for forming a pattern of the gate electrode at a specified position by etching a part of the gate electrode film.

According to this method of producing a semiconductor device, the semiconductor thin film is melted by emitting intensive light or laser beams and heat is dissipated by the heat-dissipating layer in the vicinity of a part of the thin film having the heat-dissipating layer, whereby the vicinity is quickly cooled. The cooling rate is gradually lowered as the part of the film is more and more away from the heat-dissipating layer. As a result, a temperature gradient occurs in the semiconductor thin film being cooled so that the crystal grows along the temperature gradient, i.e. along a direction of the part of the film becoming more distant from the vicinity of the heat-dissipating layer, finally developing into a crystal having a larger size.

In producing a TFT using the foregoing semiconductor thin film, a defect chiefly existing in a grain boundary is alleviated or removed, thereby leading to improvements in mobility and in other characteristics of TFT because of larger size crystal than conventional crystals, so that a semiconductor device with enhanced performance and higher reliability can be obtained. Specific methods of producing a heat-dissipating layer are referred to the aforesaid methods of producing a semiconductor thin film.

In addition, an alignment key is formed in the semiconductor thin film so that using the alignment key, a gate electrode can be formed, whereby a TFT can be formed at the desired position corresponding to the large size crystal.

Even if a large size crystal was conventionally formed in a semiconductor thin film, means for producing a TFT according to the crystal was unavailable, so that the presence or absence of grain boundary or the number of grain boundaries were variable in LDD or offset areas and a channel area, resulting in irregularities of TFT performance. However, according to the above-mentioned method of producing a semiconductor device, a TFT or a part of TFT structure can be produced in the position of large size crystal instead of the position of grain boundary. Consequently the above-mentioned problem can be alleviated.

It is preferred to form an alignment key in the same step together with a heat-dissipating layer simultaneously.

Another method of producing a semiconductor device according to the invention is characterized by comprising the steps of forming an alignment key on a part of a substrate, forming an amorphous or polycrystalline semiconductor thin film on the substrate and on the alignment key, irradiating the semiconductor thin film with high-intensity light rays or laser beams for crystallization, and forming a gate electrode film on the semiconductor thin film, wherein the alignment key is formed of a material higher in heat conductivity than the semiconductor thin film and is used at least in a photo procedure for forming a pattern of the gate electrode at a specified position by etching a part of the gate electrode film.

According to this method of producing a semiconductor device, the performance of TFT can be enhanced and a semiconductor device can be obtained with improved performance and high reliability as described above. Moreover, since the alignment key functions as a heat-dissipating layer, the productivity can be increased.

A further method of producing a semiconductor device according to the invention is characterized by comprising the steps of applying high-intensity light rays or laser beams to an amorphous semiconductor thin film formed on a substrate via an exposure mask to accomplish crystallization in a state wherein a distribution of light quantity has been established, forming an alignment key, and forming a gate electrode film on the semiconductor thin film, wherein the alignment key is formed due to the difference of color between a polycrystalline silicon area and an amorphous silicon area created in the semiconductor thin film by shutting off a part of penetrated light rays with an exposure mask, and wherein the alignment key is used at least in a photo procedure for forming a pattern of the gate electrode at a specified position by etching a part of the gate electrode film.

According to the above-mentioned method of producing a semiconductor device, a distribution of light quantity applied to the semiconductor thin film is set up, thereby establishing a temperature distribution in the semiconductor thin film according to the distribution of light quantity. As a consequence, the molten semiconductor thin film initiates solidification and crystallization at a portion involving the lowest temperature, i.e., a portion entailing the smallest irradiated light quantity. Then the crystal grows toward a portion involving a large quantity of irradiated light, eventually developing into a crystal having a large size. In producing a TFT using this semiconductor thin film, the defect existing mainly in the grain boundary is alleviated or removed due to a larger size of the crystal than conventional crystals, thereby leading to improvement in mobility and other characteristics of TFT, so that a semiconductor device with enhanced performance and higher reliability can be obtained. For specific methods of establishing the distribution of light quantity, the aforesaid methods of producing a semiconductor thin film is referred to.

Since an alignment key is formed in the semiconductor thin film, a gate electrode can be produced using the alignment key, and a TFT can be formed at the desired position with respect to the large size crystal. Consequently a TFT or a part of TFT structure can be produced in the position of large size crystal. Thus, the problem on the irregularities in performance of TFT can be alleviated.

The alignment key can be formed by applying light rays to the area of the semiconductor thin film corresponding to the key pattern formed in the exposure mask to give a polycrystalline area and by shutting off the irradiated light rays around the area with the exposure mask to give an amorphous area. Or the exposure mask may be formed such that the amorphous area is formed with only the part corresponding to the key pattern as a non-irradiation part and its periphery is irradiated with light rays to give a polycrystalline area. It is desirable to form the amorphous area and the polycrystalline area in the same layer of the semiconductor thin film.

A still further method of producing a semiconductor device according to the invention is characterized by comprising the steps of forming a gate electrode and an alignment key on a part of a substrate, forming an amorphous or polycrystalline semiconductor thin film on the gate electrode and on the alignment key, forming a heat-dissipating layer from a material higher in heat conductivity than the semiconductor thin film in a specified position of the semiconductor thin film using the alignment key and irradiating the semiconductor thin film with high-intensity light rays or laser beams for crystallization.

According to this method of producing a semiconductor device, a large size crystal can be formed in accordance with the position of the gate electrode by forming a heat-dissipating layer using the alignment key, so that the large size crystal and TFT can be positioned accurately. Therefore the foregoing performance of TFT can be increased and a semiconductor thin film having improved performance and high reliability can be formed.

(Semiconductor Device)

To achieve the foregoing objects, the semiconductor device of the invention is characterized in that the device is provided with a thin film transistor having a polycrystalline semiconductor layer, the semiconductor layer including a channel area, highly doped drain areas positioned on both sides of the channel area and LDD or offset areas positioned between the channel area and the highly doped drain areas, the LDD or offset areas being lower in dopant density than the highly doped drain areas or being free of dopant, and that any diameter of a crystal at least partly existing in the LDD or offset areas is larger than that of other crystals. The term "size (of a crystal)" used herein is a value obtained by measuring the longest size of the crystal in an optional direction in a plan view.

When a current flows in a TFT, which is on, constituting the semiconductor device, carriers moving at a high rate in the channel area may be scattered on collision with a defect of crystals. This is called "hot carrier phenomenon". The scattered carriers strike against neighboring weak bonds such as those of Si—H and cut the bonds into dangling bonds of Si. On formation of dangling bonds, other carriers are captured so that the TFT becomes extremely lower in electrical conductivity and mobility, and the performance of TFT is degraded.

The defects of crystals and bonds of Si—H concentratedly exist in the vicinity of a grain boundary. When numerous grain boundaries exist in the LDD or offset area on the drain side, the performance may be impaired and the reliability may be degraded.

The grain boundaries existing in the LDD or offset areas can be reduced compared with conventional grain boundaries or can be totally removed by giving any larger diameter to a crystal at least partly existing in the LDD or offset areas than other crystals. Thereby the performance and the reliability can be improved.

For example, the following cases fall under the above: a case wherein as shown in FIG. 30(a), a crystal C1 partly existing in an area A representing the LDD or offset area is greater in size than another crystal C2 and a grain boundary B slightly exists in the area A, or a case wherein as shown in FIG. 30(b), a crystal C3 entirely inclusive of the area A is so greater in the size than the other crystal C4 that no grain boundary exists in the area A.

The other crystal referred to above for comparison of the size is preferably one existing outside the LDD or offset area. That is, preferably any diameter of the crystal at least partly existing in the LDD or offset area is greater than other crystals existing in its entirety outside the LDD or offset area (more preferably the other crystal existing in the channel area).

When numerous grain boundaries exist in the vicinity of the boundaries between the channel area and the LDD or offset area on the drain side, the performance is more degraded and the reliability are more impaired. Therefore it is preferred that any diameter of a crystal at least partly existing in an area in the range of 0.5 µm or less on the LDD or offset area side including the boundary, away from at least one of the boundaries between the channel area and the LDD or offset areas is greater than that of the other crystal. The area is preferably 0.4 µm or less, more preferably 0.3 µm on the LDD or offset area side including the boundary.

In this case, it is desirable that any diameter of a crystal at least partly existing in said area is greater than any diameter of other crystal existing in its entirety outside the LDD or offset area (more preferably the other crystal existing in the channel area).

The present inventors conducted experiments and found that there is a interrelation (as shown in FIG. 31) between the size of a polycrystalline silicon crystal and the TFT reliability. The boundary between the channel area and the LDD or offset area which constitutes a TFT is set to coincide with the center of the diameter of the crystal. The reliability is determined by conducting a resistance test in which an on/off operation of gate voltage is repeated at 500 kHz for 1500 hours by applying 5V voltage across a source and drain in TFT's having an LDD area or an offset area, respectively to perform a switching operation at a frequency of several times and is expressed in terms of a ratio of mobility before and after the test.

As apparent from the same drawing, when the crystalline size is 0.6 µm or more, the reliability in any case of LDD area or offset area is 75% or more and is good. The more distant from the boundary between the channel area and the LDD or offset area the grain boundary is, the more reliable the TFT is. The crystalline size is preferably 0.8 µm or more, more preferably 1 µm or more.

Our review done thereafter on this matter shows that the reliability is adversely affected by the grain boundary existing in the vicinity of the area boundary on the side of LDD or offset area among the grain boundaries positioned on both sides of the area boundary. That is, an electrical field is high in the vicinity of the area boundary in the LDD or offset area on the drain side, so that when the grain boundary exists in this position, hot carriers are likely to develop. Further the semiconductor layer tends to become broken starting from the grain boundary. As a result, the TFT performance is degraded and the reliability is lowered in the case of switching operations continued for a long time or repeated many times.

Consequently, it is effective to keep the grain boundary at a specific distance away from the foregoing area boundary on the side of LDD or offset area among the grain boundaries located on both sides of the area boundary. This distance corresponds to half the crystalline size in the aforesaid experiments and is preferably 0.3 µm or more, more preferably 0.4 µm or more, most preferably 0.5 µm or more. If a configuration is so formed that the grain boundary does not exist in the range of 0.3 µm or less on the side of the LDD or offset area including the boundary away from at least one of boundaries between the channel area and the LDD or offset area. Thereby the defect of causing a hot carrier phenomenon in the vicinity is alleviated. Even if hot carriers take place, dangling bonds chiefly responsible for the degradation of performance would not occur in view of a lesser number of weak bonds such as those of Si—H. Moreover, the semiconductor layer is unlikely to become broken due to the defect, resulting in attenuated degradation of TFT performance and in increased reliability.

The area boundary without a grain boundary is negligible if it is on a drain side. However, depending on the semiconductor device, the drain and source may be exchanged for each other. In this case, it is preferable to configure the device such that the grain boundary is not present in the area boundaries on both sides of drain and source.

In the semiconductor device, it is preferable to keep the grain boundary at a distance of 0.3 µm on the channel area side, away from the boundary between the channel area and the LDD or offset area. The distance is more preferably 0.4 µm or less, most preferably 0.5 µm or less. Consequently, the grain boundary is not present in the specified distance on the side of the channel area as well as in the specified distance on the side of the LDD or offset area of the area boundary, so that the mobility is enhanced, the degradation of TFT performance is attenuated, and an increase in reliability is assured.

Another semiconductor device of the invention is characterized in that the device is provided with a thin film transistor having a polycrystalline semiconductor layer, the semiconductor layer including a channel area, highly doped drain areas positioned on both sides of the channel area and LDD or offset areas positioned between the channel area and the highly doped drain areas, the LDD or offset areas being lower in dopant density than the highly doped drain areas or being free of dopant, wherein a grain boundary is not present at least in the LDD or offset area on one side.

According to the foregoing semiconductor device, a grain boundary is not present in the LDD or offset area on the drain side having a part which is high in electrical field so that the generation of hot carriers can be suppressed, the degradation of TFT performance can be attenuated and the reliability can be enhanced.

Further when the device is so configured that a grain boundary is not present in the channel area, the mobility is improved, the degradation of TFT performance can be lowered and the increase of reliability is assured.

Furthermore, when the device is so configured that a grain boundary is not present in the highly doped drain area adjacent to the LDD area or offset area, the configuration is effective in reducing the contact resistance of source or drain and substantially increasing an on-state current of TFT.

A further semiconductor device of the invention is characterized in that the device is provided with a plurality of thin film transistors having a function in common, and that 50% (the fractional portion of the number is dropped) or more of the thin film transistors are the foregoing thin film transistors. The provision of 70% or more thereof is more preferable and the provision of 90% or more is the most preferable. For example, in a liquid crystal display device or an EL display device as an example of the semiconductor device, the TFT's for controlling the operation of each pixel, for example, are 100 in number, and the above-mentioned TFT's are preferably 50 or more in number.

According to this semiconductor device, the plurality of thin film transistors include the above-described thin film transistors at a specified ratio or more which are sufficient to attenuate the degradation of TFT performance and to increase the reliability. Thus, stable performance is assured.

Preferably each of the above-mentioned semiconductor devices has an insulating undercoat film between the substrate and the semiconductor layer. Preferably the foregoing undercoat film includes a porous layer containing pores of 0.1 to 2 μm in average pore size. The pore size can be measured by observation under an electron microscope typically having a cross section SEM·TEM.

The undercoat film including the porous layer formed between the substrate and the semiconductor layer is effective in accelerating the crystal growth of the semiconductor layer. However, the porous layer containing pores with an excessively large pore size fails to effectively prevent diffusion of dopant from the substrate to the semiconductor layer. In the case of allowing the TFT to execute switching operation continuously for a prolonged time or repeatedly many times, the threshold value (Vt) of gate voltage in change-over from an off operation to on operation is shifted. When large hollow pores exist at an interface between the channel area and the LDD area, TFT can not function, resulting in a lower yield.

From the viewpoint of the above, the porous layer has hollow pores of preferably 0.01 to 2 μm, more preferably 0.05 μm to 0.1 μm in average pore size. Thereby not only an increase of grain size in the semiconductor layer is achieved but also the percent defective of TFT is lowered. Further the threshold value (Vt) of gate voltage in change-over from an off operation to on operation can be prevented from shifting in the case of allowing the TFT to execute switching operation continuously for a prolonged time or repeatedly many times.

The insulating undercoat film formed between the substrate and the semiconductor layer may be preferably so configured as to include a porous layer containing pores 0.001 μm to 2 μm in average pore size and a denser layer formed on the porous layer than the porous layer.

According to this semiconductor device, the diffusion of dopant can be prevented by the dense layer constituting the undercoat film, the percent defective of TFT is lowered and the threshold value (Vt) of gate voltage in change-over from an off operation to on operation can be prevented from shifting in allowing the TFT to execute switching operation continuously for a prolonged time or repeatedly many times. In addition, the crystal growth in the semiconductor layer is accelerated by the porous layer constituting the undercoat film.

A still further semiconductor device of the invention is characterized in that the thin film transistor is formed in the vicinity of the pattern in the specified shape which is made of a material higher in heat conductivity than the semiconductor layer.

According to this semiconductor device, a large size crystal can be easily formed in the semiconductor layer by the pattern in the specified shape which is made of a material higher in heat conductivity than the semiconductor layer.

The above-mentioned pattern is preferably formed between the substrate and the semiconductor layer, and is more preferably covered with the insulating undercoat film formed between the substrate and the semiconductor layer. Thereby the pattern can be used as an alignment key in the photo procedure in production of a semiconductor device.

The undercoat film may be composed of a first undercoat film (upper undercoat film) and a second undercoat film (lower undercoat film). The above-described pattern may be formed between the first undercoat film and the second undercoat film. In this case, the first undercoat film may be preferably made thinner than the second undercoat film so that the heat conductivity is increased and a larger size crystal can be formed. The above-mentioned pattern is formed of preferably a metal film, and can be formed in the vicinity of the drain area, channel area or source area of the semiconductor layer.

It is possible to produce a semiconductor device wherein the semiconductor thin film on the periphery of the pattern contains a crystal of longer size than in other parts. The pattern may be provided in contact with the semiconductor thin film. It is also possible to produce a semiconductor device wherein the crystals in the semiconductor thin film positioned immediately on or under the pattern have a shorter size than the crystal in the semiconductor thin film on the periphery of the pattern.

The foregoing semiconductor devices can be produced, for example, by the above-mentioned method of producing a semiconductor device. For example, the following semiconductor devices can be produced by the above-mentioned method of producing a semiconductor device.

A semiconductor device which is characterized in that the device is provided with a thin film transistor having a semiconductor layer formed on a substrate, the semiconductor layer including a channel area, highly doped drain areas positioned on both sides of the channel area and LDD or offset areas positioned between the channel area and the highly doped drain areas, the LDD or offset areas being lower in dopant density than the highly doped drain areas or being free of dopant, and that any diameter of the crystal existing in the vicinity of the boundary between the channel area and the LDD or offset areas is larger than that in other areas.

A semiconductor device which is characterized in that the device is provided with a thin film transistor having a semiconductor layer formed on a substrate, the semiconductor layer including a channel area, and highly doped drain areas positioned on both sides of the channel area, and that the size of crystal existing in the vicinity of the boundary between the channel area and the highly doped drain area is larger than in other areas.

A semiconductor device which is characterized in that the device is provided with a thin film transistor having a semiconductor layer formed on a substrate, the semiconductor layer including a channel area, highly doped drain areas positioned on both sides of the channel area and LDD or offset areas positioned between the channel area and the highly doped drain areas, the LDD or offset areas being lower in dopant density than the highly doped drain areas or being free of dopant, and that the size of the crystal in the source area is different from that of the crystal In the LDD or offset area, or the size of the crystal in the source area is different from that of the crystal in the drain area (e.g., the size of the crystal in the drain area is smaller than in the source area).

A semiconductor device which is provided with a thin film transistor having a semiconductor layer formed on a substrate, and that one grain boundary exists in one channel area of the semiconductor layer.

Another semiconductor device of the invention is characterized in that the thin film transistor has a semiconductor layer formed of a polycrystalline semiconductor thin film and a pattern in the specified shape formed of an amorphous semiconductor thin film.

According to this semiconductor device, the pattern in the specified shape can be used as an alignment key in a photo procedure in production of the semiconductor device. Preferably the polycrystalline semiconductor thin film and the amorphous semiconductor thin film constitutes the same layer.

The foregoing semiconductor devices include, for example, a liquid crystal display device and an EL display device which allow each pixel to operate by feeding a voltage via the semiconductor device including a plurality of thin film transistors. In this case, the lifetime can be prolonged to an extent to which point defects or line defects appear in images. Further, the accuracy of fine images and uniformity of image luminance can be improved, and the yield and reliability can be increased. In an EL display device, pixels and a driving circuit can be produced using the above-mentioned TFT, and can be driven and can perform image display with such TFT. The EL display device includes both of an inorganic EL display and an organic EL display.

BEST MODE OF CARRYING OUT THE INVENTION

The embodiments of the invention will be described with reference to the accompanying drawings.

(Embodiment 1)
(Semiconductor thin film)

First, a method of producing a semiconductor thin film will be described. The producing methods in this embodiment and in the other embodiments can be carried out in the same manner relating to semiconductor thin films made of, e.g., GaAs, Ge, SiGe, SiGeC or the like. Nevertheless, the methods will be discussed mainly relating to silicon (Si) generally used these days.

Figure 1:
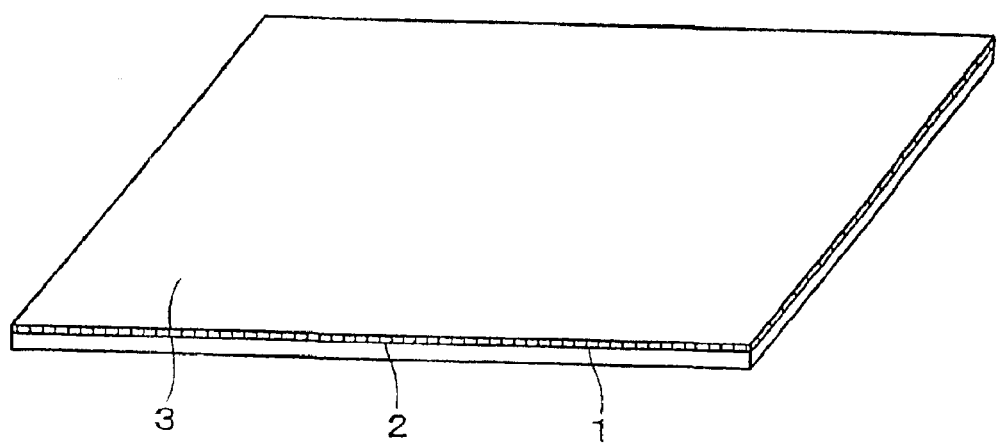
FIG. 1 is a perspective view showing a substrate having an amorphous silicon film formed thereon in a method of producing a semiconductor thin film as an embodiment 1 of the present invention.

As shown in FIG. 1, an undercoat film 2 formed of $SiO_2$ having a thickness of 300 nm is formed on a substrate 1, e.g., by a TEOS-CVD method in order to prevent diffusion of dopants from the substrate 1. The thickness of the undercoat film 2 is not limited to 300 nm but can be set in a broad range. The substrate 1 is made of glass in this embodiment, and may be composed of plastics or may be films. Silicon nitride films or the like can be used as the undercoat film 2. No problem would be posed if a $SiO_2$ film or silicon nitride film has a thickness of 200 nm or more. The film thickness of less than 200 nm would permit diffusion of dopants from the substrate 1 through a silicon layer 9 and would be likely to raise a problem on Vt shift of TFT performance and the like.

Subsequently an amorphous silicon film 3 is formed on the undercoat film 2 by a plasma CVD method. In forming the amorphous silicon film 3, a reduced pressure CVD method or sputtering may be employed. The thickness of the amorphous silicon film 3 may be in the range of preferably 30 to 90 nm. The thickness of 50 nm was adopted in this embodiment.

Next, to remove hydrogen from the amorphous silicon film 3 thus formed, the film 3 was dehydrogenated by heat treatment at 450° C. for 1 hour. However, dehydrogenation is not required when executing a film-forming method such as sputtering or the like which would entail the incorporation of little or no hydrogen into the amorphous silicon film 3.

Figure 2:
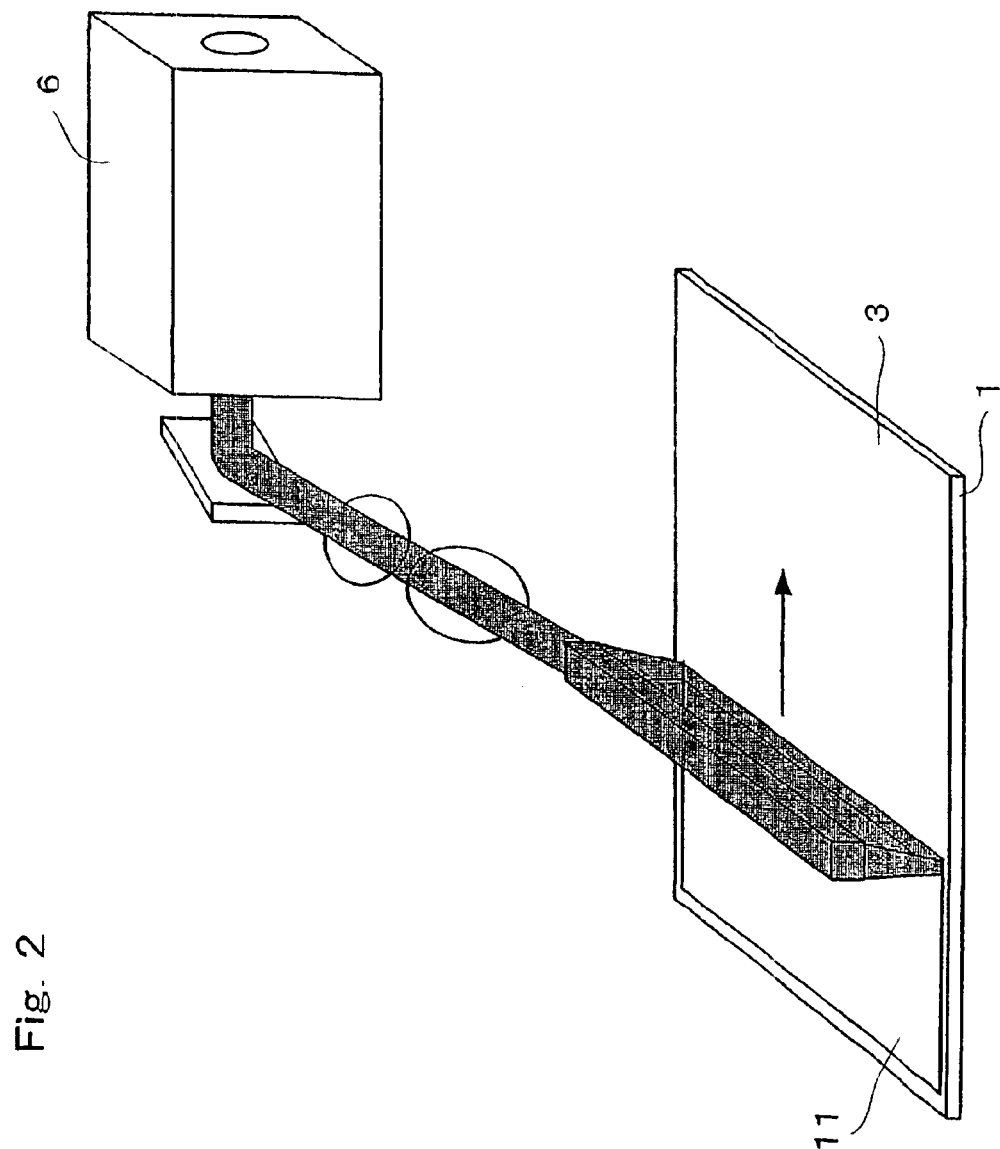
FIG. 2 is a schematic configuration diagram of a laser anneal device to be used in the method of producing a semiconductor thin film.

Then, pre-irradiation of laser beams is performed with a laser anneal device (ELA device) 6 as shown in FIG. 2. In this embodiment, laser beams are applied repeatedly 10 times (10 pulses) to one position while moving the substrate on a stage (not shown) using XeCl excimer laser (wavelength 308 nm). Optionally laser beams may be applied by moving a laser irradiator on a fixed substrate instead of moving a substrate.

The laser beams for crystallization are absorbed into the silicon film for generation of heat. Thus, it is necessary to employ laser beams having a short wavelength of 500 nm or less. The shorter the wavelength of laser is, the higher the absorption efficiency is. Hence such laser is preferable. In the invention, crystallization is achieved with use of XeCl excimer laser (308 nm in wavelength). Useful laser beams include those in the range of 500 nm or less in wavelength. For example, ArF, KrF or like excimer laser, Ar laser and the like are employed. Although a pulse laser is used in the description of this embodiment, laser beams of continuous waver (CW) are also employable. In this case, the number of pulses in the following description is made to correspond to the irradiation time.

When laser beams 7 are applied to the amorphous silicon film 3, the beams 7 are applied at an energy density of about 160 mJ/cm² or more at room temperature to bring about crystallization, whereby a polycrystalline silicon film 11 is successively formed in an arrow direction. The irradiation area is necessarily determined to calculate the energy density. In the specification, the irradiation area was determined by measuring a distribution of laser intensity, and calculating the area of a space defined by linking the positions at which ½ the highest intensity was exhibited.

Figure 3:
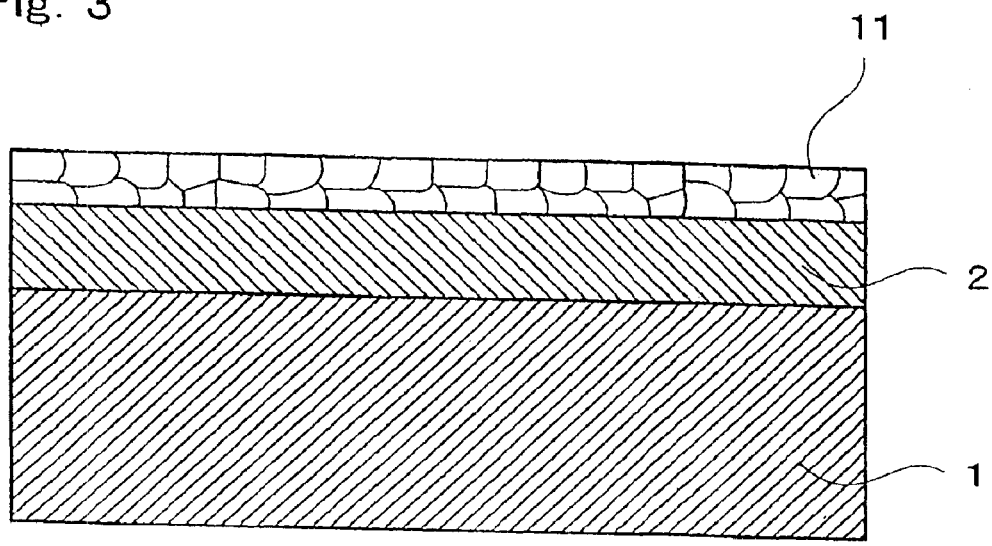
FIG. 3 is a sectional view showing a state of the film after application of laser beams in the method of producing a semiconductor thin film.

In this pre-irradiation step, a highly membraneous polycrystalline silicon film 11 is not needed. Crystals of small size are unlikely to develop crystalline defects in the step of forming a silicon film containing crystals of large size which is executed later. For example, the amorphous silicon film 3 is crystallized by application of laser beams at a relatively low intensity of 170 to 280 mJ/cm². In this embodiment, laser beams are applied at 250 mJ/cm², giving a polycrystalline film 11 having crystals with a size of 30 nm or less as shown in FIG. 3.

Figure 8:
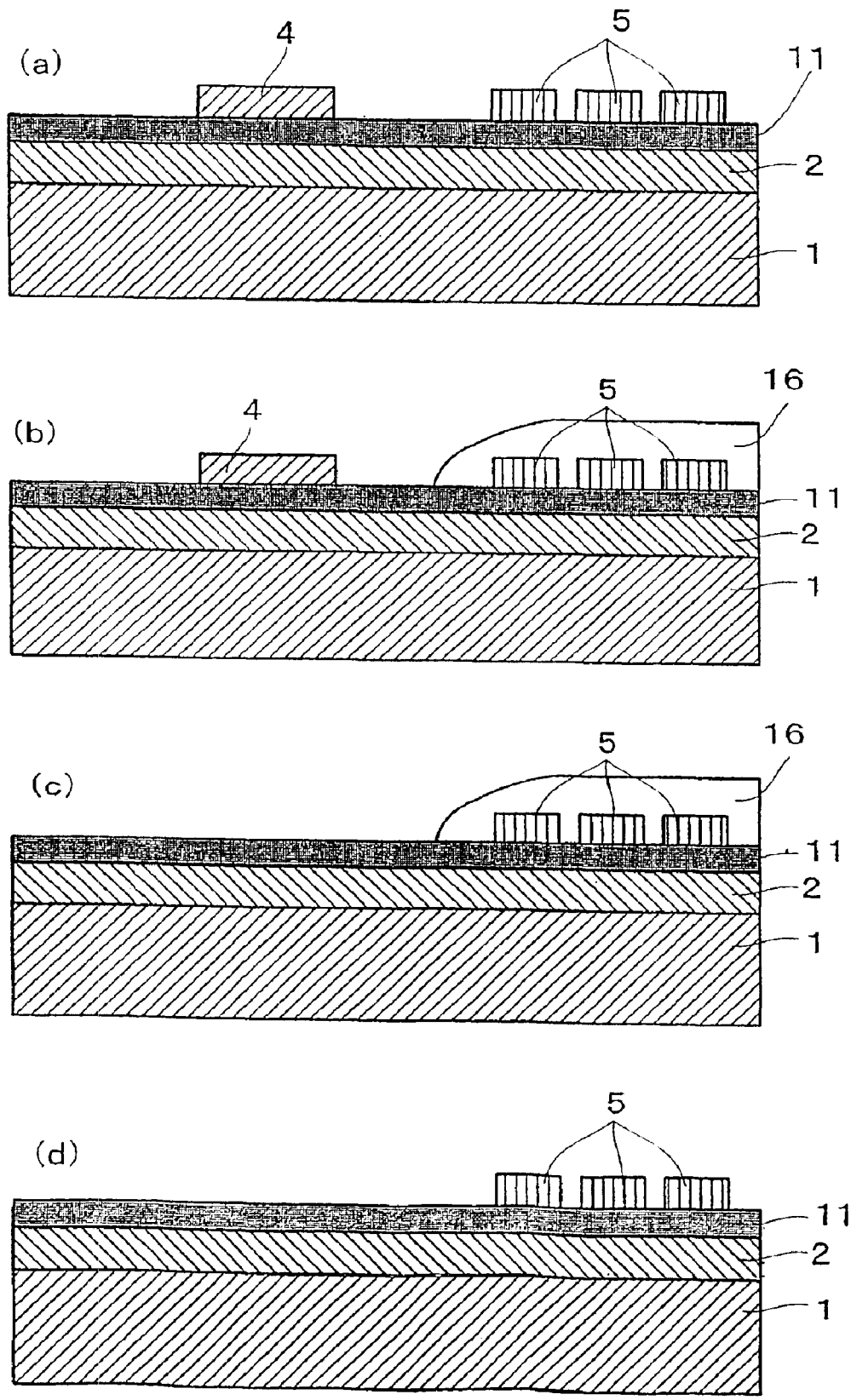
FIG. 8 is a sectional view for describing a step of removing the heat-dissipating layer in the method of producing a semiconductor thin film.

Then, a heat-dissipating layer 4 and alignment keys 5 are formed on the polycrystalline silicon film 11 as shown in FIG. 8(a) using a mask for forming a pattern. In this embodiment, the film is formed by vapor deposition but can be formed also by means such as sputtering.

The heat-dissipating layer 4 is formed of a material higher in heat conductivity than the polycrystalline silicon film 11. Suitable materials are substantially all of metals and alloys thereof including Al, Ti, Ni, Cr, Ti, Ko, W. Cu, Au, Ag, Pt, Ta, In and the like. Metal oxides such as ITO (InTio) which are high in heat conductivity can be used. This matter can apply to the following embodiments. In this embodiment, the heat-dissipating layer 4 and alignment keys 5 were made of molybdenum-tungsten alloy (MoW). In this embodiment, the heat-dissipating layer 4 takes a rectangular shape in a plan view and may assume other shapes including a triangle, circle and ellipse.

Figure 5:
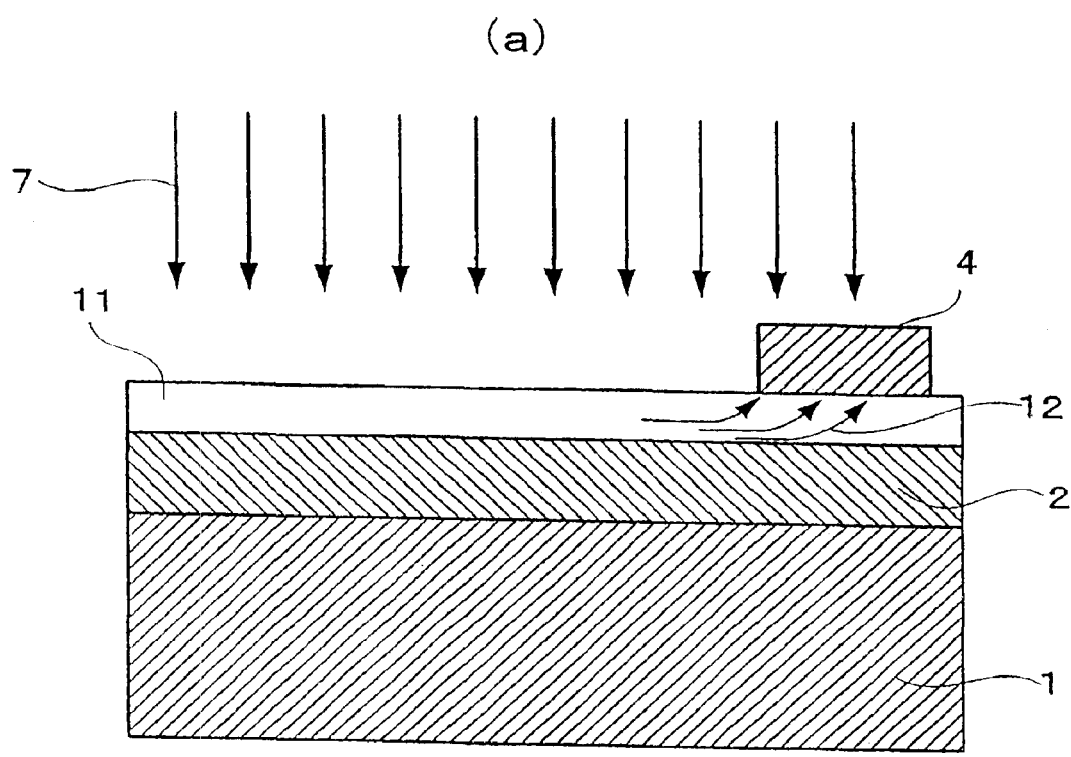
FIG. 5(a) is a sectional view showing a state of a primary irradiation step in the method of producing a semiconductor thin film.
FIG. 5(b) shows a temperature distribution of the silicon film according to the primary irradiation step.
Figure 5:
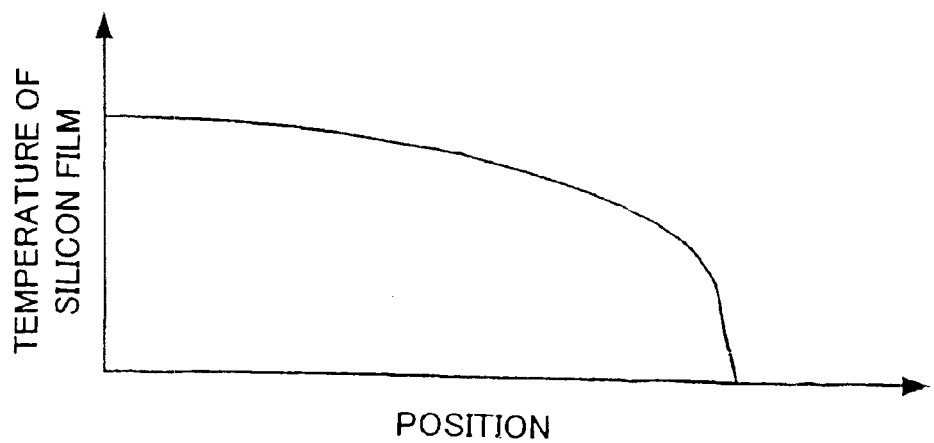

Thereafter the primary irradiation step is executed using the laser anneal device (ELA device) again as shown in FIG. 5(a). A lower limit of laser intensity in the primary irradiation step is higher than in the above-mentioned pre-irradiation step. An upper limit of laser intensity is lower than a value at which the polycrystalline silicon film 11 initiates change of properties or vaporization. More specifically, the intensity of laser beams 7 is in the range of 280 mJ/cm² to 420 mJ/cm² and is 380 mJ/cm² in this embodiment. Further the upper limit and the lower limit of laser intensity are preferably substantially proportional to the thickness of the silicon film 3. The intensity is preferably in the range which fulfils a relationship of $3.78Ta+138 \leq El \leq 4.54Ta+153$ wherein Ta is the thickness (nm) of the silicon film 3 and El is an intensity density of laser beams.

With an increase in the frequency of applying laser beams 7 to one position, the irradiation intensity becomes more stable, and the crystal size and film quality become uniform so that the performance of TFT to be produced later is stabilized. On the other hand, the Increased frequency results in a prolonged irradiation time and in decrease of productivity. From this point of view, a preferred frequency of irradiation of laser beams 7 to one position is in the range of about 10 to about 30 times. In this embodiment, laser beams are applied to one position at a frequency of 20 times while moving the substrate at a suitable pitch. When irradiation is performed at a frequency of 100 times or more at one position, the mobility in the case of producing a TFT is increased to about 1.5 times as high as at a frequency of 20 times.

Figure 6:
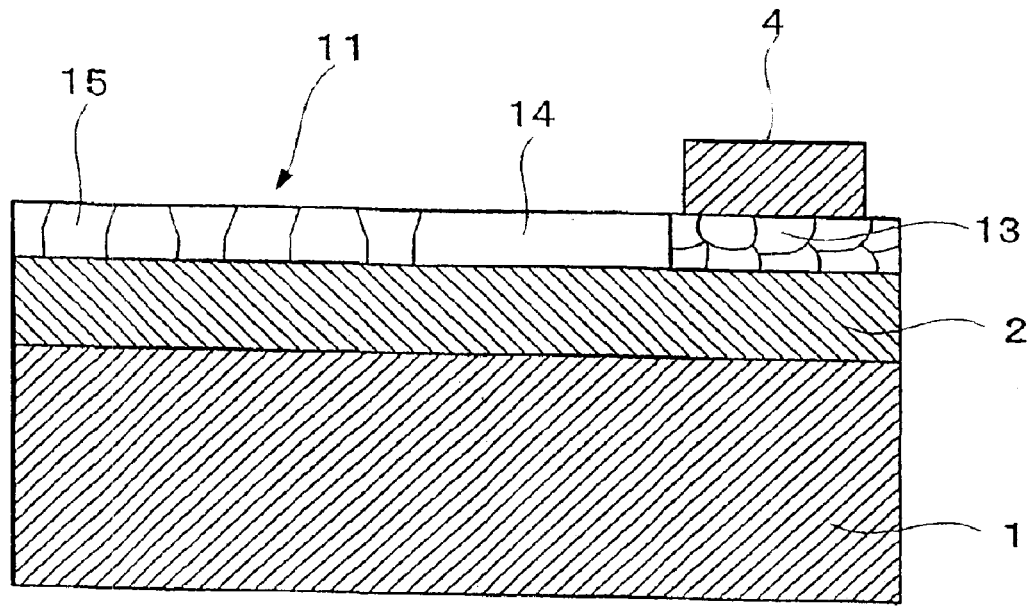
FIG. 6 is a sectional view showing a state in which a large size crystal has been formed in the silicon film due to the presence of the heat-dissipating layer in the method of producing a semiconductor thin film.

The silicon film 11 which has become polycrystalline in the pre-irradiation step is melted again by the primary irradiation step. In the vicinity of the heat-dissipating layer 4 on the molten silicon film 11, heat is transferred in an arrow direction 12 toward the heat-dissipating layer 4 which is higher in heat conductivity than the silicon film 11 so that the film 11 is quickly cooled. The cooling rate becomes increasingly lower in a position far and far from the heat-dissipating layer 4. As shown in FIG. 5(b), a temperature gradient is brought about in the vicinity of the heat-dissipating layer 4 after a specified lapse of time. At a part of the film where the temperature gradient is established, crystallization proceeds from a low temperature side to a high temperature side. As a result, a large size crystal 14 is formed in the silicon film 11 in the vicinity of the heat-dissipating layer 4 as shown in FIG. 6 while smaller size crystals 15 are formed at a part of the film 11 far away from the heat-dissipating layer 4. A region 13 under the heat-dissipating layer 4 is not melted and retains the same state as the crystallization state in the pre-irradiation step, because the region 13 is not irradiated with laser beams due to the presence of the heat-dissipating layer 4 serving as a mask.

Figure 7:
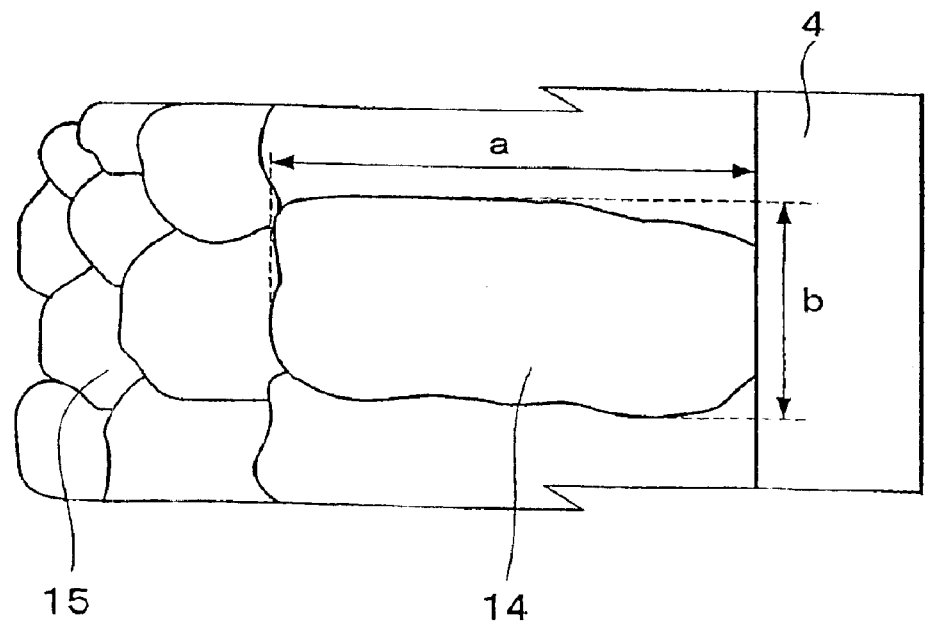
FIG. 7 is a plan view showing the vicinity of the large size crystal.

The shape of the large size crystal 14 in a plan view is shown in FIG. 7. The size of the crystal was measured under an interatomic force microscope (ATFM) and a transmission electron microscope (TEM). It was found that a size a in a lengthwise direction, i.e., in a direction of the temperature gradient brought about, was 1 μm and a size b in a widthwise direction, i.e., a direction orthogonal to the lengthwise direction on a plane was 0.5 μm. The crystal size is expressed in terms of a maximum distance between grain boundaries in respective directions. A significant defect was not found in the crystal 14.

The size of small size crystals 15 on the periphery of the large size crystal 14 was measured in the same manner as above and was 100 nm or less which was substantially the same as the size of crystals in the polycrystalline silicon film formed in the conventional irradiation step. As described above, at the primary irradiation step in this embodiment, the size of the crystal in the silicon film can be selectively increased in the vicinity of the heat-dissipating layer 4, namely in a specified position, resulting in improvement of film quality.

Then, a step of removing the heat-dissipating layer 4 is carried out. As shown in FIG. 8(a), the alignment keys 5 are formed on the polycrystalline silicon film 11 together with the heat-dissipating layer 4. First, a protective film 16 such as a resist is formed on the alignment keys 5 and solidified by drying (FIG. 8(b)). Thereafter the heat-dissipating layer 4 is removed by dry etching or wet etching (FIG. 8(c)). Finally the protective film 16 is removed with a release agent (FIG. 8(d)). Thereby the heat-dissipating layer 4 is removed while the alignment keys are left, whereby the semiconductor thin film is completed. Numerous dangling bonds are formed in the polycrystalline silicon film 11. The dangling bonds of silicon atoms are terminated with hydrogen, e.g., by being left in hydrogen plasma-at 450° C. for 2 hours. The concentration of hydrogen is, for example, about $2 \times 10^{20}$ atom·cm$^{-3}$.

Figure 9:
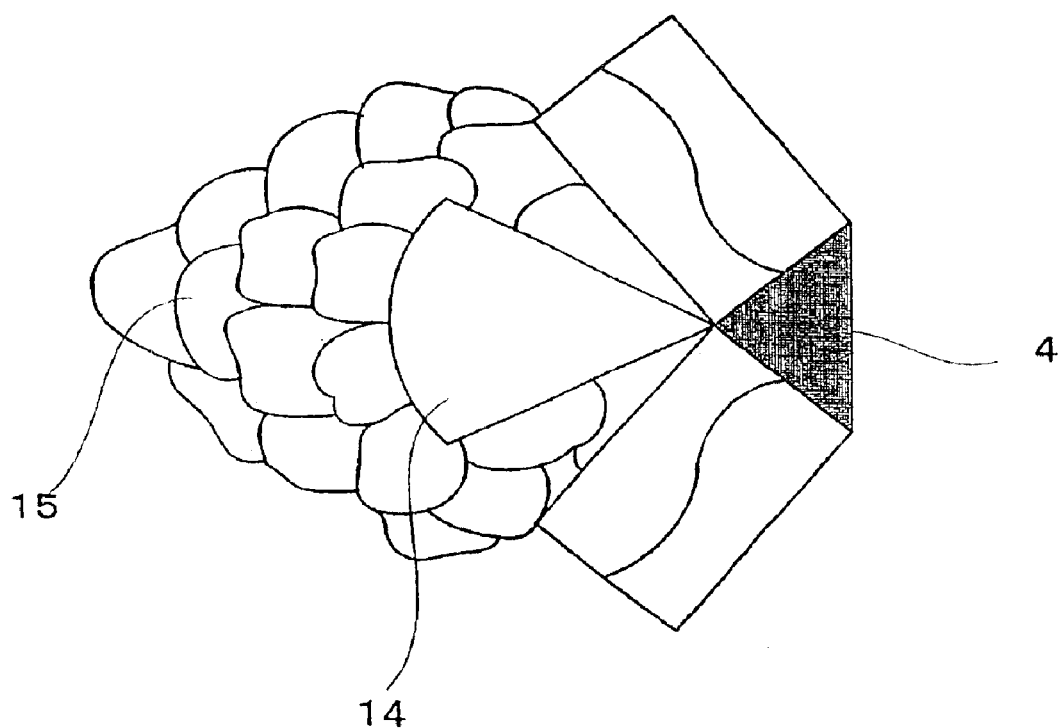
FIG. 9 is a plan view showing the shape of the large size crystal when the shape of the heat-dissipating layer has been changed in the method of producing a semiconductor thin film.

In the production of the semiconductor thin film in this embodiment, the heat-dissipating layer 4 is formed in a rectangular shape in a plan view, preferably in a triangular shape in a plan view. Because of the heat-dissipating layer 4 formed in this shape, crystal growth is initiated from the top of the heat-dissipating layer 4 after the primary irradiation step. As shown in FIG. 9, the large size crystal 14 is made to assume a substantially fan-like shape in a plan view. In this case, the starting point of crystal growth is a point and thus definite, the positioning of a large size crystal and a TFT can be easily achieved in the course of producing a TFT to be described later.

(Semiconductor Device)

Figure 10:
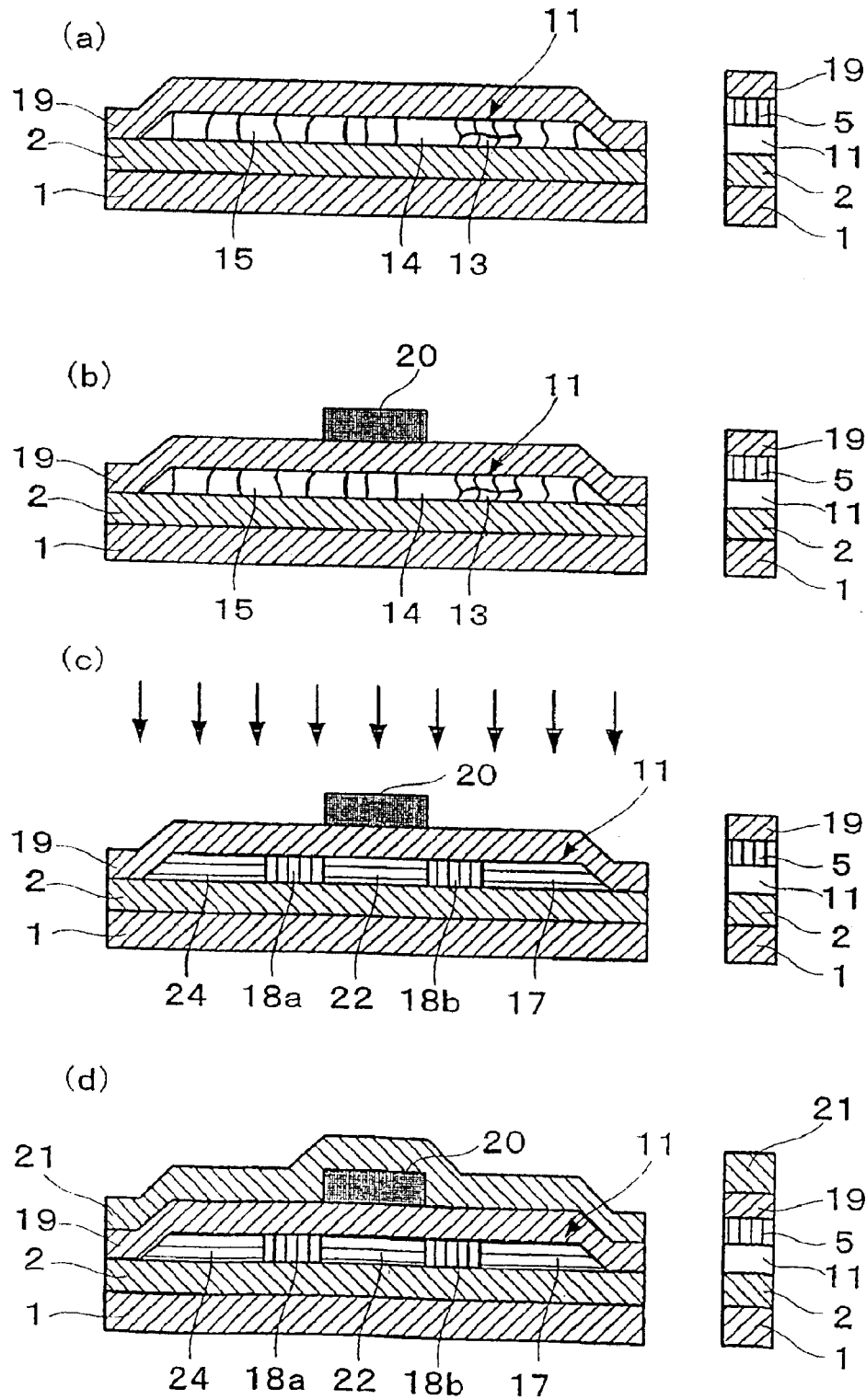
FIG. 10 is a sectional view for describing a step of producing a TFT constituting the semiconductor device in the method of producing a semiconductor device as the embodiment 1 of the present invention.

Next, a method of producing a thin film transistor (TFT) constituting a semiconductor device will be described. First, using the semiconductor thin film formed by the above-mentioned method as shown in FIG. 10 (a), the polycrystalline silicon film 11 having the large size crystal 14 is subjected to a photo procedure or etching procedure with the alignment keys 5. After patterning in the form of an island, a gate insulating film 19 is formed of silicon oxide. The alignment keys 5 are used for positioning the mask in the photo procedure to be described below. The gate insulating film 19 can be formed by subjecting a film of SiO$_2$, e.g., to plasma CVD using TEOS. The film 19 requires a thickness of, e.g., 100 nm. The film 19 can be also formed, e.g., by reduced pressure CVD, remote plasma CVD, normal pressure CVD, ECR-CVD or the like or by a high pressure oxidation or plasma oxidation.

As shown in FIG. 10(b), a gate electrode 20 is formed on the gate insulating film 19. The gate electrode 20 can be produced, e.g., by a method comprising forming a molybdenum-tungsten alloy film by sputtering, effecting a photo procedure using a photo mask for a gate electrode, and patterning the film in the specified shape by etching. Other materials for forming a gate electrode include a highly pure Al and an Al material prepared by mixing Al with at least one species selected from Si, Cu, Ta, Sc. Zr and the like.

A mask (not shown) to be used in the photo procedure can be positioned by the alignment keys 5. A gate electrode 20 is set in the vicinity of the large size crystal 14 of polycrystalline silicon film 11. More specifically, the gate electrode 20 Is formed in such manner that an end of the gate electrode 20 on the drain side (right side in the drawing) coincides with the center of the large size crystal 14.

Then, an ion doping step is carried out as shown in FIG. 10(c). First, phosphorus in a low concentration is injected into the silicon film 11 using the gate electrode 20 as a mask by an ion doping device. Thereby a channel area 22 is formed immediately under the gate electrode 20 in the silicon film 11. P-channel or n-channel transistors can be selectively produced by selective use of dopants other than phosphorus including boron or arsenic as an acceptor and aluminum as a donor. A CMOS circuit can be formed on the substrate.

Then, after forming a resist pattern over the gate electrode 20 and in the range of 2 μm away from both ends thereof by a photo procedure, highly concentrated phosphorus is injected into the silicon film 11 by an ion doping device using the resist pattern as a mask. As a result, highly doped drain areas are formed at portions not covered with the resist pattern on both sides of the channel area 22 in the silicon film 11. The highly doped drain areas are represented by a source area 24 and a drain area 17. LDD areas 18a, 18b which are lower in dopant density than the highly doped drain areas reside between the channel area 22 and the highly doped drain area 24, and between the channel area 22 and the highly doped drain area 17, respectively.

Thereafter the resist is removed. The injected dopants are activated by heat treatment or other means. As to activation of injected ions, an annealing procedure need not be additionally executed because of occurrence of self activation by the hydrogen injected together. To assure the activation, however, the film may be locally heated by anneal at 400° C. or higher, irradiation of excimer laser beams, RTA (rapid thermal anneal) or the like.

Thereafter, an interlaminar insulating layer 21 of silicon oxide is formed all over as shown in FIG. 10(d). The interlaminar insulating layer 21 can be formed by subjecting a film of $SiO_2$, e.g., to a plasma CVD using TEOS, or of course, by other methods, e.g., AP-CVD (atmospheric pressure CVD) method, LTO (low temperature oxide), ECR-CVD or the like. The interlaminar insulating layer 21 may be formed of silicon nitride, tantalum oxide, aluminum oxide or the like, or may be a laminate of thin films made of these materials.

Then, contact holes are formed by etching in the interlaminar insulating layer 21 and the gate insulating film 19 to reach the source area 24 and the drain area 17 of the polycrystalline silicon film 11. Then, a titanium film or an aluminum zirconium alloy film is sputtered onto the contact holes and patterned in the specified shape by etching to make a source electrode 23a and a drain electrode 23b. The source electrode 23a and the drain electrode 23b may be formed of other materials than the aluminum zirconium alloy, such as aluminum (Al), tantalum (Ta), molybdenum (Mo), chrome (Cr), titanium (Ti) or like metals or alloys thereof, or poly-Si containing a large quantity of dopants. A transparent electroconductive layer of poly-Si Ge alloy, ITO or the like may be used.

By the foregoing process, an n-type TFT 40 as shown in FIG. 11(a) is completed. In need of a p-type TFT, B doping procedure is executed instead of injecting phosphorus.

Figure 11:
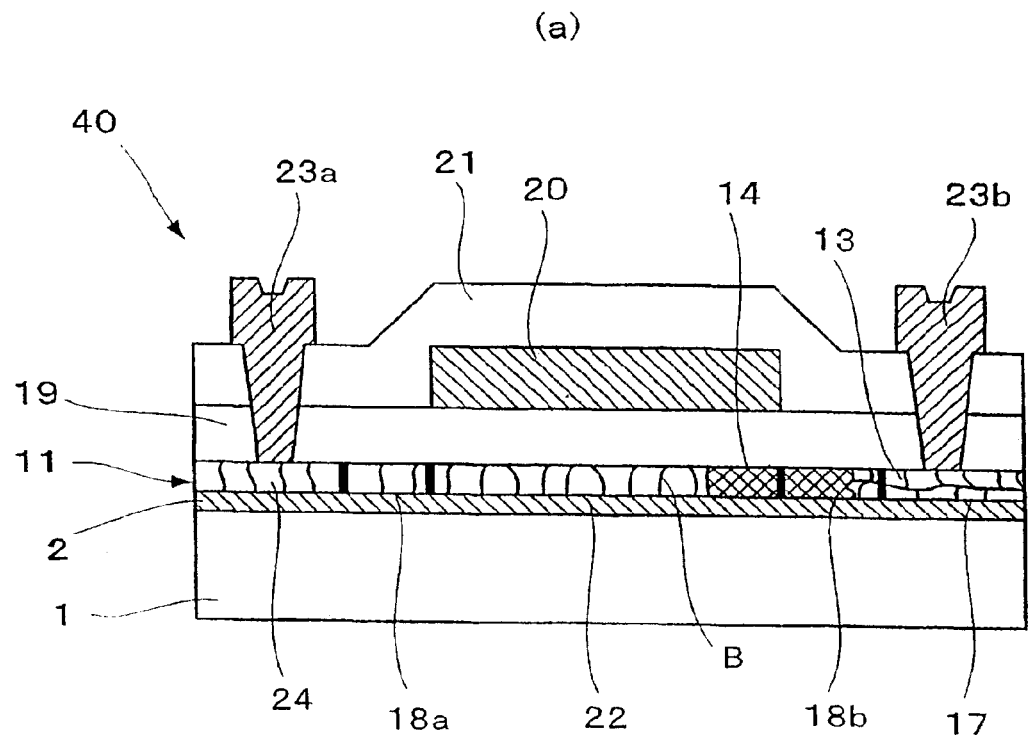
FIG. 11(a) is a sectional view showing the positional relationship between the large size crystal and the TFT in the semiconductor device as the embodiment 1 of the invention and FIG. 11(b)) is a plan view showing the same.
Figure 11:
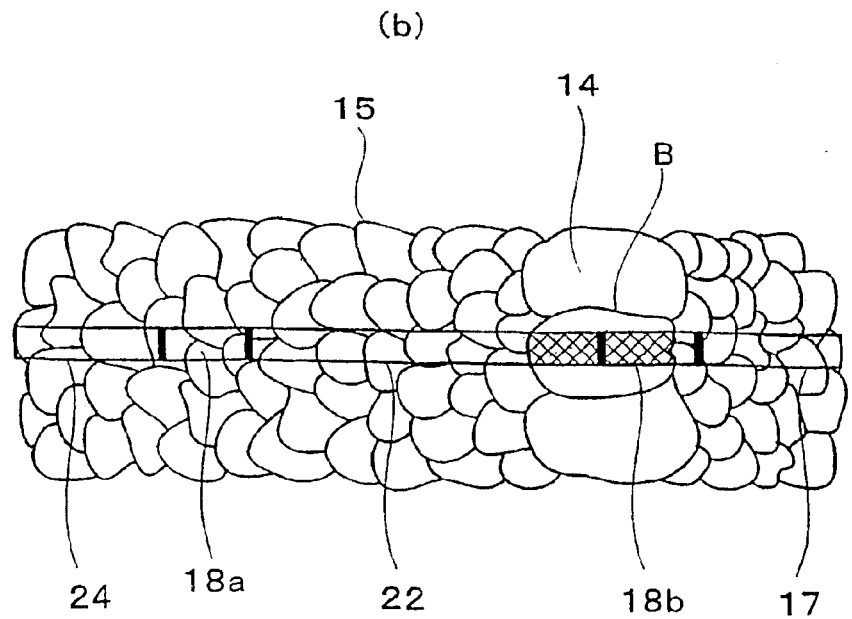

In the TFT of this embodiment, the gate electrode 20 is formed in such a manner that the end of the gate electrode 20 on the drain side coincides with the center of the large size crystal 14. Consequently a single crystal exists, as shown in FIG. 11, in the range (range shown with a net lines in the drawing) of 0.5 µm away from both sides of the boundary between the LDD area 18b on the drain side and the channel area 22 wherein a grain boundary B is absent. Therefore the degradation of TFT due to generation of hot carriers can be prevented and the reliability can be increased. In the production of a semiconductor thin film, the heat-dissipating layer 4 is formed not only in the vicinity of the drain area 17 but also in the vicinity of the source area 24 to thereby avoid the presence of grain boundary B in the vicinity of the boundary between the LDD area 18a on the source side of TFT 40 and the channel area 22 (e.g. the range of 0.5 µm away from both sides), whereby the performance and reliability can be further improved.

The mobility of the TFT 40 in this embodiment was measured and was found to be 180 $cm^2$/V·s. The mobility was significantly enhanced compared with the mobility of 100 $cm^2$/V·s of conventional TFT's produced using the semiconductor thin film formed without forming a heat-dissipating layer 4. A reliability test was carried out by repeating the switching operation several times, more specifically, an on/off operation of gate voltage at 500 kHz for 1500 hours at 5V voltage applied across the source and drain. The mobility of the above conventional TFT was decreased by about 50% from the initial mobility value, whereas the mobility of TFT 40 in this embodiment was 85% or higher of the initial value, which means that the degradation of performance due to switching was reduced. The same reliability test was conducted under the same conditions in respect of the embodiments described below.

(Liquid Crystal Display Device)

Figure 12:
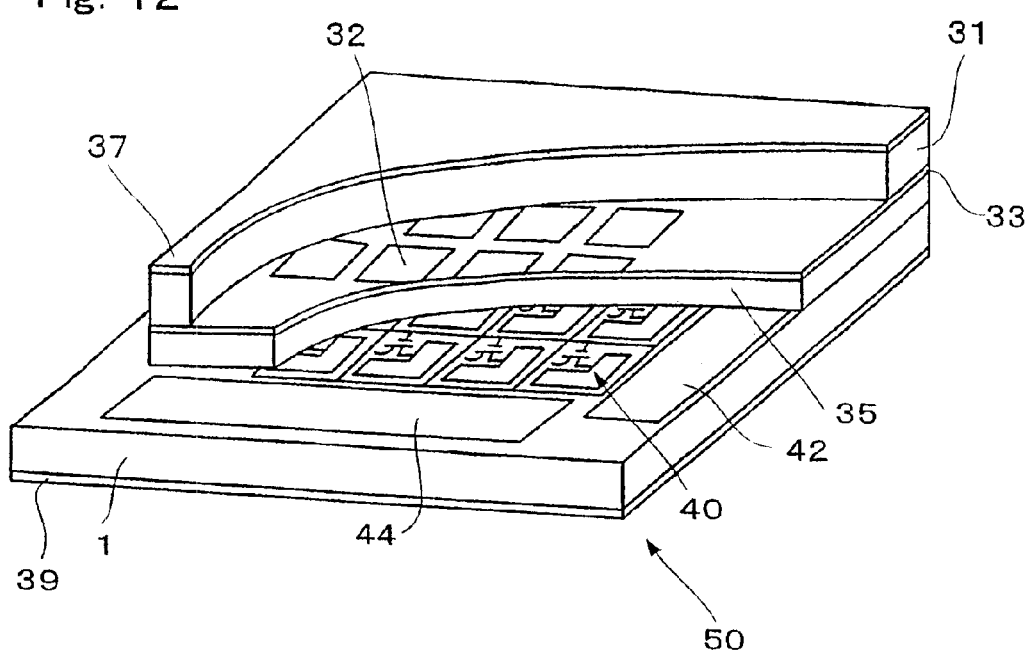
FIG. 12 is a perspective view schematically showing a liquid crystal display device partly cut away as an example of the semiconductor device according to the embodiment 1 of the invention.

A liquid crystal display device having TFT's produced by the foregoing methods will be described. As shown in FIG. 12, a liquid crystal display device 50 has a TFT array substrate 1 and an opposed substrate 31 arranged in opposition to each other.

The TFT array substrate 1 is provided with a plurality of TFT's 40 on the side of an upper surface (on the side of the opposed substrate 31) arrayed in a matrix with driving circuits 42, 44 on the periphery of TFT 40. The opposed substrate 31 is a glass substrate (e.g. Corning Co., Ltd., Lot No. 1737) serving as an insulating substrate and has a color filter 32 and a transparent electrode 33 on the side of an underside surface (on the side of the TFT array substrate 1). A liquid crystal member 35 liquid-tightly containing a liquid crystal between orientated films of polyamide or the like is interposed between the TFT array substrate 1 and the opposed substrate 31. Polarizing plates 37, 39 are fixed to the surfaces in opposition to the opposed surfaces of the TFT array substrate 1 and the opposed substrate 31.

Figure 13:
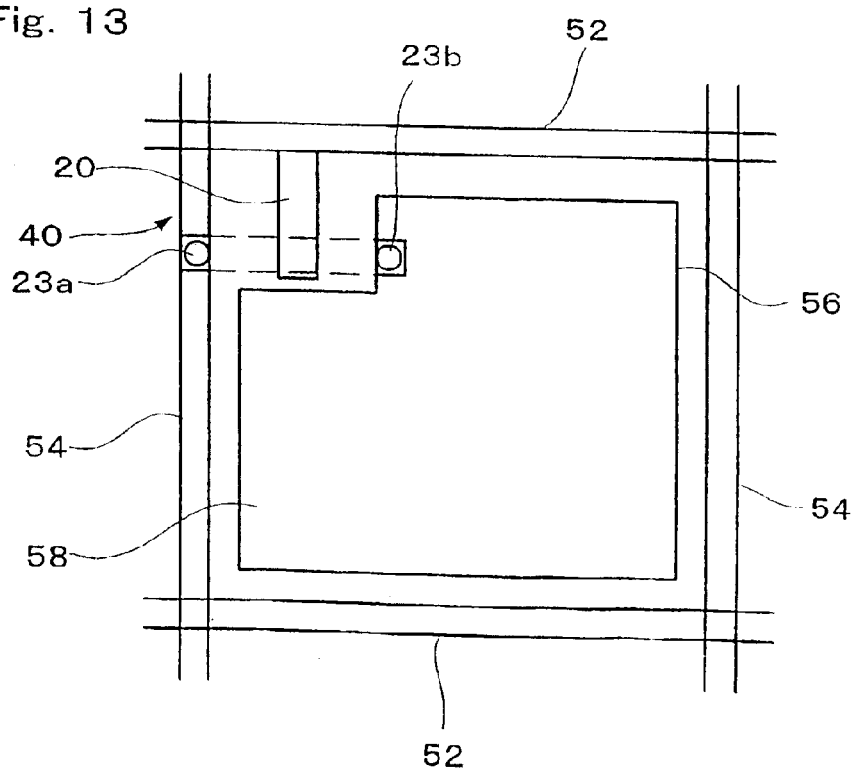
FIG. 13 is a schematic plan view showing a part of the liquid crystal display device.

One of pixel areas 56 in the TFT array substrate 1 is shown in an enlarged form in FIG. 13. A scanning line 52 and a data line 54 are arranged in a matrix on the TFT array substrate 1 and the TFT 40 is disposed in the neighborhood of each crossing portion. A source electrode 23a of the TFT 40 is connected to the data line 54 while a drain electrode 23b is linked to a pixel electrode 58 as a transparent electrode. The gate electrode 20 is connected to a scanning line 52.

The liquid crystal display device 50 thus configured was decreased in percent defective of driving circuit and was mitigated in defects such as irregularities in the luminance of image plane due to improved performance of TFT array and reduction in degradation of performance. More specifically, the driving circuit in a liquid crystal display device having conventional TFT's was 15% in percent defective, whereas the liquid crystal display device 50 in this embodiment was decreased to 7% in percent defective. The conventional device was 7% in percent defective in respect of irregularities in the luminance of image plane while the liquid crystal display device 50 in this embodiment was decreased to 3% in percent defective.

(EL Display Device)

Next, an EL display device provided with the TFT's produced by the above-described method will be stated below. The EL display device is equipped with a TFT array substrate which includes a TFT for switching, a TFT for driving and an EL element in each pixel region.

Figure 14:
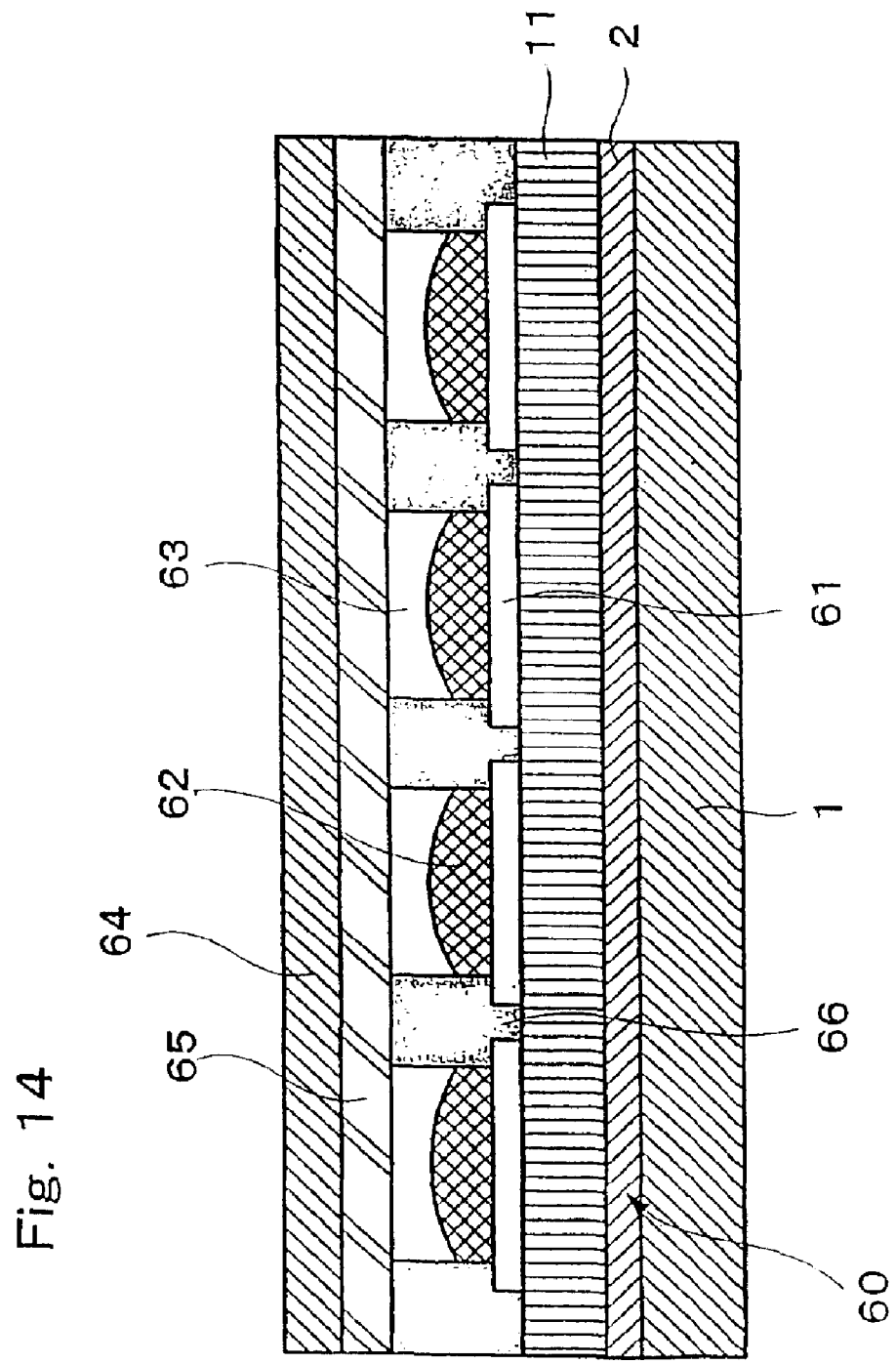
FIG. 14 is a sectional view showing an EL element of the EL display device as an example of the semiconductor device in the embodiment 1 of the invention.

As shown in FIG. 14, an EL element 60 has anodes 61 comprising a transparent electrode made of ITO or the like, a luminescent layer 62, a hole injection layer 63 and a cathode 64 made of AlLi or the like, which are all laminated on a polycrystalline silicon film 11. An aluminum quinolinol complex layer 65 is formed on the underside surface (side of substrate 1). A resin black resist is laid between respective anodes 61. A light intercepting layer 66 is formed by photolithography. The luminescent layer 62 is formed, e.g., by applying luminescent materials for red, green and blue colors in a pattern with an ink jet print device. The hole injection layer 63 is formed, for example, by vacuum deposition of polyvinyl carbazole.

The El element 60 is made of a polydialkylfluorene derivative in this embodiment and can be formed of other organic materials such as other polyfluorene materials and polyphenyl vinylene materials, or inorganic materials. The EL element 60 can be produced by spin coat or like coating methods, vapor deposition and ink jet for forming an extrusion. The producing methods can be suitably determined according to the materials used.

Figure 15:
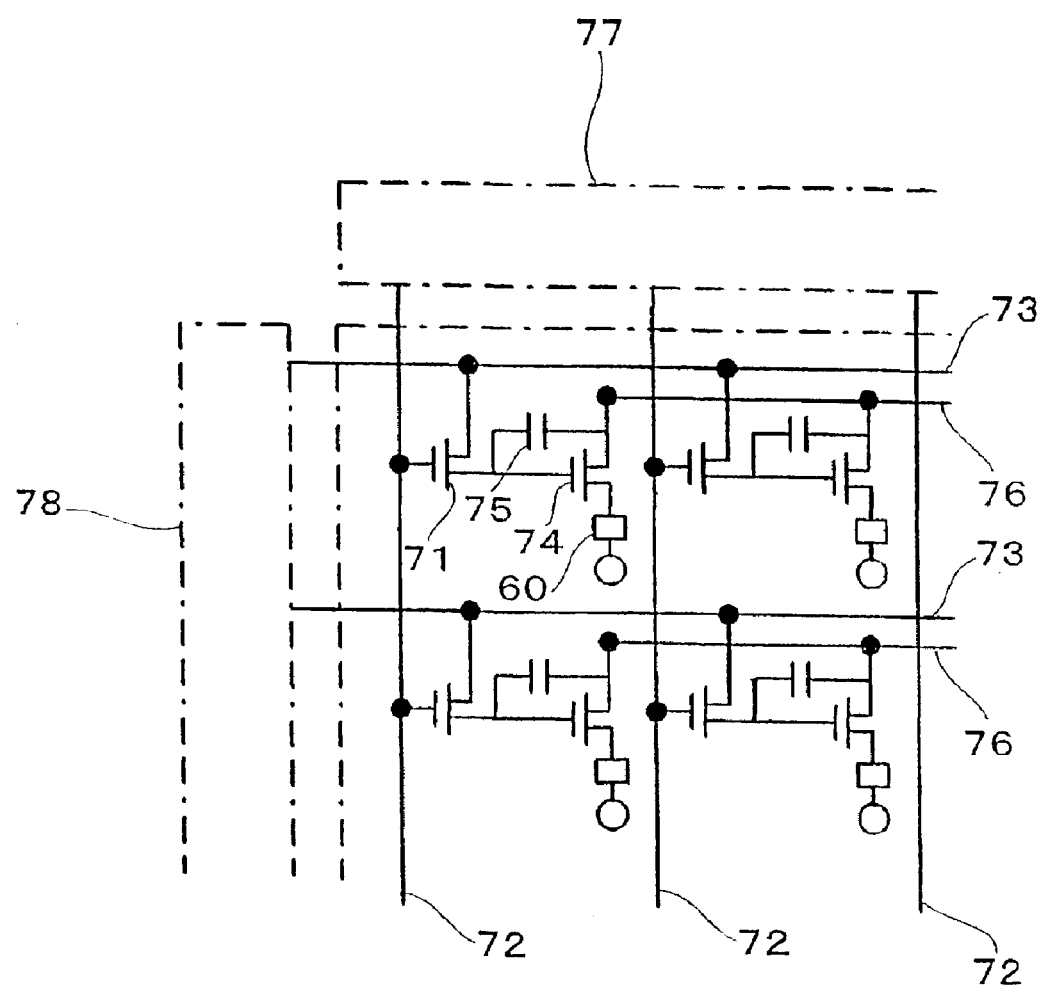
FIG. 15 is a circuit diagram showing a part of the EL display device.

FIG. 15 is a circuit diagram of the EL display device. The gate electrode of a TFT 71 for switching is connected to a gate signal line 72 while a drain electrode is connected to a drain signal line 73. A source electrode is connected to the gate electrode of TFT 74 for driving. The source electrode of TFT 74 for driving is connected to the anode of EL element 60. The drain electrode is connected to a power source line 76. Indicated at 75 is a condenser.

When a pulse signal fed to the gate signal line 72 by a driving circuit 77 is applied to the gate electrode of TFT 71 for switching, the TFT 71 for switching is brought to an on state. A drain signal fed to a drain signal line 73 by a driving circuit 78 is applied to the gate electrode of TFT 74 for driving. Thereby the TFT 74 for driving is brought to an on state, so that a current is supplied from a power source line 76 to the EL element 60, thereby allowing the EL element 60 to emit light.

The EL display device thus configured exhibited an alleviated degree of defects such as irregularities in the luminance of image plane and low image quality due to the improved performance of TFT array and lessened degradation of performance. More specifically, the device having conventional TFT's was 8% in percent defective in respect of irregularities in the luminance of image plane, whereas the EL device 50 in this embodiment was reduced to 2% in percent defective in respect of this defect. The performance of TFT was impaired in the case of switching operation continued for a long time or repeated a large number of times, leading to deteriorated image quality, but the defects were lessened from 15% in percent defective in the conventional device to 5% in percent defective in this embodiment.

(Embodiment 2)

An embodiment 2 of the invention will be described. Constituent parts having the same function in this embodiment and in the following embodiments as those described above in the embodiment 1 are indicated by the same reference numerals in the drawings. The description of this embodiment on the matters already stated in respect of the embodiment 1 will be omitted.

A method of producing a semiconductor thin film in the embodiment 2 is characterized in that in the method of producing a semiconductor thin film in the embodiment 1, laser light beams 7 in the primary irradiation step is applied at a frequency which is different from that involved in the embodiment 1. More specifically, laser beams 7 are repeatedly applied to a specified range of region on the substrate a plurality of times in the embodiment 1, whereas laser beams are modulated so as to accomplish irradiation to the entire surface of the substrate at one time (one pulse) and is applied to the specified range of region only at one time in the embodiment 2. A preferred intensity range of laser light beams 7 is the same as in the embodiment 1.

The size of the large size crystal 14 in the semiconductor thin film thus obtained was measured under an interatomic force microscope (ATFM) and a transmission electron microscope (TEM). It was found that a size a in a lengthwise direction in a plan view was 1.6 $\mu$m and a size b in a widthwise direction was 0.5 $\mu$m (see FIGS. 6 and 7). A serious defect was not found in the crystal 14. As described above, it is desirable to irradiate only one pulse to a single part on the substrate in the primary irradiation step from the viewpoint of forming a silicon film including a crystal of greater size.

Using the obtained semiconductor thin film, a semiconductor device, a liquid crystal display device and an EL display device were produced in the same manner as in the embodiment 1. In producing a TFT constituting the semiconductor device, a mask was positioned with alignment keys such that in view of 1.6 $\mu$m size of the large size crystal, the end of the gate electrode on the drain side was positioned in the center of the large size crystal, i.e. in the range of 0.8 $\mu$m away from the grain boundary. Consequently a single crystal was permitted to exist in the range of 0.8 $\mu$m away from both sides of the boundary between the LDD area 18b on the drain side and the channel area 22, which means the absence of grain boundary.

The TFT thus obtained exhibited a mobility of 180 cm$^2$/V·s and 95% or more of the initial mobility value after the resistance test, namely both improved over the mobility of conventional TFT's. The liquid crystal display device was 3% in percent defective of the driving circuit and 0.8% in percent defective in respect of irregularities in the luminance of image plane, i.e., both good compared with the levels in the conventional liquid crystal display device. The EL display device was 1% in percent defective in respect of irregularities in the luminance of image plane, and 2% in percent defective in the image quality, i.e., both good compared with the levels in the conventional EL display device.

(Embodiment 3)

An embodiment 3 of the invention will be described. A method of producing a semiconductor thin film according to the embodiment 3 is different from the method of the embodiment 1 in that in the embodiment 3, the step of forming a heat-dissipating layer 4 and an alignment key 5 is carried out without executing the pre-irradiation step, and this step is done by liftoff.

Figure 16:
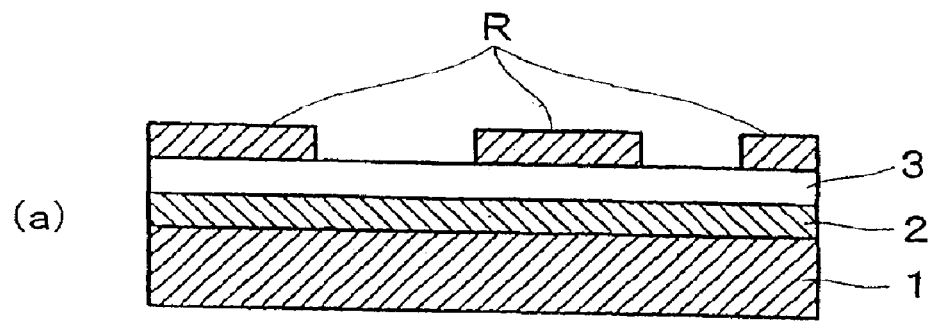
FIG. 16 is a sectional view for describing a step of forming a heat-dissipating layer and an alignment key(s) in the method of producing a semiconductor thin film as an embodiment 3 of the invention.
Figure 16:
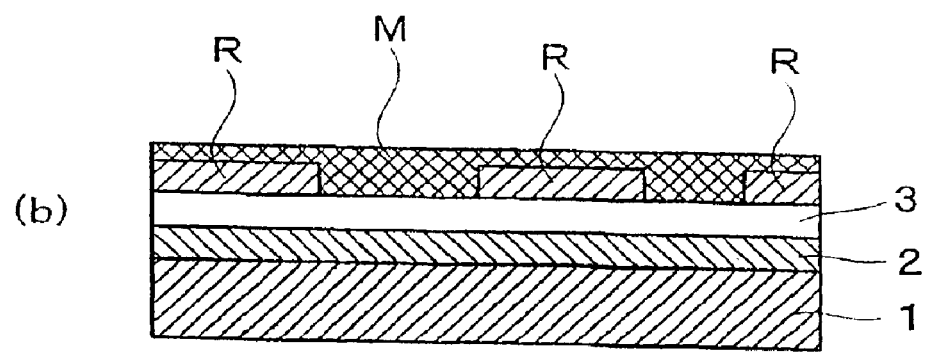
Figure 16:
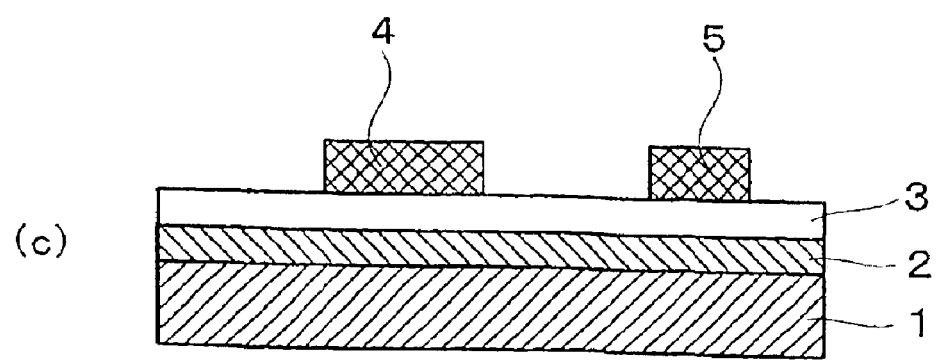

More specifically, a resist pattern R is formed by applying a resist to the dehydrogenated amorphous silicon film 3 by photolithography to cover other portions than portions corresponding to the heat-dissipating layer 4 and the alignment key 5 (FIG. 16(a)). An MoW film M is formed by vapor deposition (FIG. 16(b)). Then the heat-dissipating layer 4 and the alignment key 5 are formed by removing the resist pattern R and the MoW film M on the resist pattern R by a resist release agent to form the heat-dissipating layer 4 and the alignment key 5 (FIG. 16(c)).

Next, the primary irradiation step is carried out to form a polycrystalline silicon film. Laser light beams 7 are applied by the primary irradiation step in this embodiment preferably at the same range of intensity as in the embodiment 1. The laser intensity is 380 mJ/cm$^2$ in this embodiment. The frequency of irradiation to the specific one location on the substrate is 8 times (8 pulse). Thereby a large size crystal is formed around the heat-dissipating layer 4 (see FIG. 6). Thereafter the heat-dissipating layer 4 is eliminated in the same manner as in the embodiment 1.

Since the pre-irradiation step is not executed in the embodiment 3 as in the embodiment 1, amorphous silicon is laid in an area under which the heat-dissipating layer 4 was formed. Consequently an additional irradiation step may be performed with a laser anneal device (ELA device) to crystallize this area. Since a highly membraneous layer is not required at the area where the heat-dissipating layer 4 was formed, the laser intensity in the additional irradiation step is sufficient even if the intensity is lower than in the primary irradiation step. An excessively high laser intensity may cause a defect in the large size silicon crystal 14 formed in the primary irradiation step. Hence it is not preferred. Thus, the laser intensity in the additional irradiation step of this embodiment is preferably the same as in the pre-irradiation step of the embodiment 1 and is 250 mJ/cm$^2$ in this embodiment. The frequency of irradiation to one location on the substrate is 10 times. The frequency of irradiation may be various. Thereby polycrystalline silicon with a small size of 30 nm or less is formed in the area where the heat-dissipating layer 4 was laid.

The size of the large size crystal 14 in the semiconductor thin film thus obtained was measured under an interatomic force microscope (ATFM) and a transmission electron microscope (TEM) and was found to be about 2 $\mu$m. A serious defect was not discovered in the crystal 14. One hundred crystals 14 were checked to investigate the irregularities of the size, and the range of size was 2 μm ±4 μm, namely the size was not highly irregular compared with the range of 1.6 μm ±0.8 μm in the case of irradiation at a single pulse instead of irradiation of laser beams at a plurality of pulses in the primary irradiation step of the embodiment 1.

Using the obtained semiconductor thin film, a semiconductor device, a liquid crystal display device and an EL display device were produced in the same manner as in the embodiment 1. In producing a TFT constituting the semiconductor device in this embodiment, an offset area is formed in the following manner instead of forming an LDD area in the ion doping step of the embodiment 1.

Figure 17:
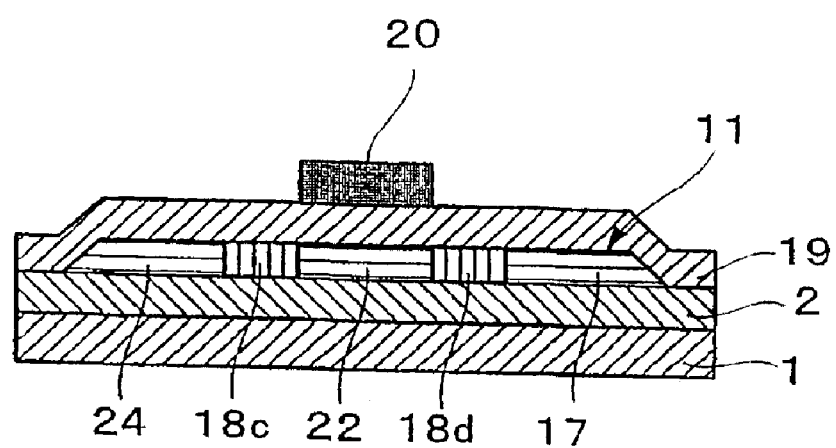
FIG. 17 is a sectional view showing a state wherein an offset area of TFT constituting the semiconductor device is formed in the method of producing a semiconductor device as an embodiment 3 of the invention.

First, a resist pattern is formed on the gate electrode 20 and over a region of 2 μm away from both ends of electrode 20. Then, highly concentrated phosphorus is injected with the resist used as a mask by an ion doping device. As a result, as shown in FIG. 17, a channel area 22 exists under the gate electrode 20 and offset areas 18c, 18d are formed in a region of 2 μm away from both ends of the channel area 22. Highly doped drain areas are formed at portions not covered with the resist pattern. The highly doped drain areas are a source area 24 and a drain area 17. Thereafter a semiconductor device is produced in the same manner as in the embodiment 1.

A mask is positioned with an alignment key 5 such that in view of 2 μm size of the large size crystal, the end of the gate electrode 20 on the drain side coincides with the center of the large size crystal, i.e., in a region of 1 μm away from the grain boundary. As a consequence, a single crystal exists in the range of 1 μm away from both sides of the boundary between the offset area 18d on the drain side and the channel area 22, which means the absence of grain boundary in the TFT.

The TFT thus obtained exhibited a mobility of 200 cm$^2$/V·s and 95% or more of the initial mobility value after the resistance test, namely both good compared with the mobility of conventional TFT's. The liquid crystal display device was 2.5% in percent defective of the driving circuit and 0.6% in percent defective in respect of irregularities in the luminance of image plane, namely both good compared with the levels in the conventional liquid crystal display device. The EL display device was 0.7% in percent defective in respect of irregularities in the luminance of image plane, and 1.2% in percent defective of the image quality, both better than the levels in the conventional EL display device.

(Embodiment 4)

An embodiment 4 of the invention will be described. In a method of producing a semiconductor thin film according to the embodiment 4, the step of forming a heat-dissipating layer 4 and an alignment key 5 is carried out without executing the pre-irradiation step as in the method of producing a semiconductor thin film according to the embodiment 3. Further the step of forming a heat-dissipating layer 4 and an alignment key 5 is carried out by a photo procedure or an etching procedure.

Figure 4:
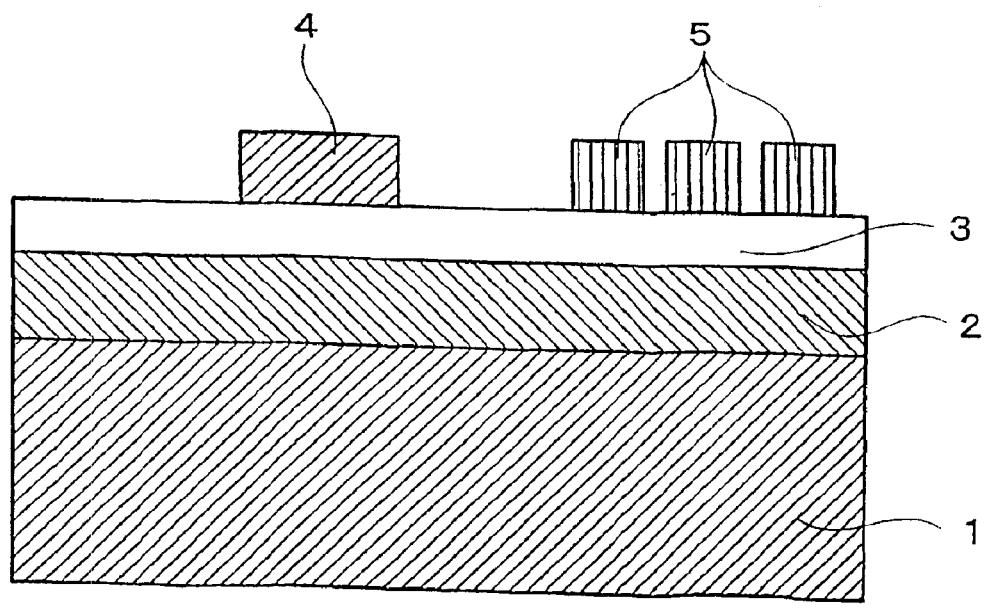
FIG. 4 is a sectional view showing a state wherein a heat-dissipating layer and an alignment key have been formed on the amorphous silicon film in the method of producing a semiconductor thin film.

That is, on a dehydrogenated amorphous silicon film 3 is formed by vapor deposition or sputtering a film of InTio (ITO), i.e., a material which is higher in heat conductivity than the silicon film and which allows laser light beams to penetrate therethrough. A heat-dissipating layer 4 and an alignment key 5 made from an ITO pattern in a specified shape are formed by a photo procedure and an etching procedure (see FIG. 4).

Thereafter a primary irradiation step is executed to form a polycrystalline silicon film. In this embodiment, laser beams are applied to one location on the substrate at an intensity of 360 mJ/cm$^2$ at a frequency of 300 times (300 pulses). Thereby a large size crystal 14 is formed around the heat-dissipating layer 4 (see FIGS. 6 and 7). Subsequently the heat-dissipating layer 4 is removed in the same manner as in the embodiment 1.

In this embodiment, a pre-irradiation step is not carried out as in the embodiment 3. Since the heat-dissipating layer 4 is formed of ITO having a light transmitting property, the silicon film under the heat-dissipating layer 4 is crystallized by the primary irradiation step. Thus, an additional irradiation step is not needed as in the embodiment 3, thereby contributing to simplification of the production process.

The size of the large size crystal 14 in the semiconductor thin film thus obtained was measured under an interatomic force microscope (AFM) and a transmission electron microscope (TEM). It was found that a size a in a lengthwise direction was 4 μm and a size b in a widthwise direction was 0.5 μm (see FIGS. 6 and 7). A significant defect was not found in the crystal. A hundred crystals 14 were checked to investigate the irregularities of the size, and the range of size was 4 μm ±0.4 μm, namely the size was not markedly irregular compared with the range of 1.6 μm ±0.8 μm in the case of irradiation at a single pulse in the primary irradiation step of the embodiment 1.

Using the obtained semiconductor thin film, a semiconductor device, a liquid crystal display device and an EL display device were produced in the same manner as in the embodiment 1. In producing a TFT constituting the semiconductor device in this embodiment, a mask for forming a gate was positioned by the alignment key 5 such that the gate electrode 20 coincided with the center of the large size crystal 14. That is, in view of 4 μm size of the large size crystal 14 in a lengthwise direction thereof, the end of the gate electrode 20 on the drain side was positioned 0.8 μm away from the grain boundary by setting the length at 2.5 μm in a source-drain direction of the gate electrode 20. In conformity therewith, a channel area under the gate electrode 20 was given a channel length of 2.5 μm, while LDD areas 18a, 18b on both sides of the channel area 22 were given an LDD length of 0.8 μm, so that a single crystal continuously extends over a region including the channel area 22 and the LDD areas 18a, 18b, thereby bringing about a state in which no grain boundary exists (see FIG. 11).

The TFT thus obtained exhibited a mobility of 320 cm$^2$/V·s and 97% or more of the initial mobility value after the resistance test, namely both good compared with the mobility of conventional TFT's. The liquid crystal display device was 1.5% in percent defective of the driving circuit and 0.4% in percent defective in respect of irregularities in the luminance of image plane, i.e., both good compared with the levels in the conventional liquid crystal display device. The EL display device was 0.5% in percent defective in respect of irregularities in the luminance of image plane, and 1.2% in percent defective of the image quality, both better than the conventional EL display device.

(Embodiment 5)

An embodiment 5 of the invention will be described. In a method of producing a semiconductor thin film according to the embodiment 5, a heat-dissipating layer 4 and an alignment key 5 are formed by a photo procedure and an etching procedure instead of being formed by vapor deposition using a mask for forming a pattern as done in the method of producing a semiconductor thin film according to the embodiment 1.

A film of MoW which is higher in heat conductivity than a silicon film is formed by vapor deposition or sputtering on the polycrystalline silicon film made by the pre-irradiation step. A heat-dissipating layer 4 and an alignment key 5 made from an MoW pattern in a specified shape are formed by a photo procedure and an etching procedure (see FIG. 8(a)).

Next, the primary irradiation step is carried out to form a polycrystalline silicon film 11. Laser light beams 7 are applied preferably at an intensity of 360 mJ/cm² in this embodiment. The frequency of irradiation to one location on the substrate is 300 times (300 pulses). Thereby a large size crystal 14 is formed around the heat-dissipating layer 4. Thereafter the heat-dissipating layer 4 is eliminated in the same manner as in the embodiment 1.

The size of the large size crystal 14 in the semiconductor thin film thus obtained was measured under an interatomic force microscope (AFM) and a transmission electron microscope (TEM). It was found that a size a in a lengthwise direction was 4 μm and a size b in a widthwise direction was 0.5 μm (see FIGS. 6 and 7). A significant defect was not found in the crystal.

Using the obtained semiconductor thin film, a semiconductor device, a liquid crystal display device and an EL display device were produced in the same manner as in the embodiment 1. In producing a TFT constituting the semiconductor device in this embodiment, an offset area was formed in the same manner as in the embodiment 3 instead of forming an LDD area in the ion doping step of the embodiment 1 (see FIG. 17).

In this embodiment, a mask for forming the gate was positioned by the alignment key 5 such that the gate electrode 20 was positioned in the center of the large size crystal 14. In view of 4 μm size of the large size crystal 14 in a lengthwise direction thereof, the end of the gate electrode 20 on the drain side was positioned 0.8 μm away from the grain boundary by setting the length at 2.5 μm in a source-drain direction of the gate electrode 20. In conformity therewith, a channel area under the gate electrode 20 was given a length of 2.5 μm, while LDD areas 18c, 18d on both sides of the channel area 22 were given a length of 0.8 μm, so that a single crystal continuously extended over a region including the channel area 22 and the LDD areas 18c, 18d, thereby bringing about a state in which no grain boundary existed.

The TFT thus obtained exhibited a mobility of 310 cm²/V·s and 97% or more of the initial mobility value after the resistance test, namely both good compared with the mobility of conventional TFT's. The liquid crystal display device was 2% in percent defective of the driving circuit and 0.4% in percent defective in respect of irregularities in the luminance of image plane, i.e., both good compared with the levels in the conventional liquid crystal display device. The EL display device was 0.4% in percent defective in respect of irregularities in the luminance of image plane, and 1% in percent defective of the image quality, namely both good compared with the levels in the conventional EL display device.

(Embodiment 6)

An embodiment 6 of the invention will be described. A method of producing a semiconductor thin film according to the embodiment 6 is characterized in that in the embodiment 1, minute empty apertures are formed in an undercoat film formed on a substrate. A silica solution mainly containing Si, O and an organic solvent is applied to a substrate 1 which is being rotated. An alcohol (methanol) is used as the organic solvent in this embodiment. Then the coated substrate 1 is heat-treated, whereby an undercoat film 2 of Siox including empty apertures is formed (see FIG. 1). A suitable temperature for heat treatment is in the range of 450 to 650° C., preferably 550 to 620° C. for forming more minute apertures and for mitigating the warping of the substrate. In this embodiment, a temperature of 600° C. is employed for heat treatment.

When the solidification of silica is executed at 400° C. as in the conventional heat treatment, the empty apertures have an average diameter of about 10 μm. In the case of solidification at 600° C., the average diameter of empty apertures is lessened to 2 μm or less. An average diameter of empty apertures is preferably in the range of 0.01 to 2 μm, and more preferably in the range of 0.05 to 0.1 μm.

Subsequently a semiconductor thin film was produced in the same manner as in the embodiment 5. The size of the large size crystal 14 in the semiconductor thin film was measured under an interatomic force microscope (ATFM) and a transmission electron microscope (TEM). It was found that a size a in a lengthwise direction was 30 μm and a size b in a widthwise direction was 0.5 μm (see FIGS. 6 and 7). A serious defect was not found in the crystal 14. Small size crystals 15 were 200 μm or less in the size.

Using the obtained semiconductor thin film, a semiconductor device, a liquid crystal display device and an EL display device were produced in the same manner as in the embodiment 1. In producing a TFT constituting the semiconductor device of this embodiment, the gate electrode was formed such that the center of the gate electrode coincided with the center of the large size silicon crystal, using a photo mask for patterning the polycrystalline silicon layer and designed to incorporate the channel area, LDD areas, source area and drain area in the large size crystal 14. The length of the gate electrode in a source-drain direction was 4 μm. Thus the n-type TFT thus obtained had a channel length of 4 μm, an LDD length of 1.5 μμm, and a source length and drain length, respectively of 10 μm. The areas continuously extended to give a single crystal which means the absence of grain boundary.

The TFT thus obtained exhibited a mobility of 380 cm²/V·s and 97% or more of the initial mobility value after the resistance test, namely both improved over the mobility of conventional TFT's. The percent defective was significantly lowered because the undercoat film had an average aperture diameter of 2 μm or less and was markedly decreased in the average aperture diameter compared with the apertures diameter of conventional porous undercoat film.

The liquid crystal display device was 1.5% in percent defective of the driving circuit and 0.3% in percent defective in respect of irregularities in the luminance of image plane, namely both good compared with the levels in the conventional liquid crystal display device. The EL display device was 0.3% in percent defective in respect of irregularities in the luminance of image plane, and 0.7% in percent defective of the image quality, i.e., both good compared with the levels in the conventional EL display device.

(Embodiment 7)

An embodiment 7 of the invention will be described. A method of producing a semiconductor thin film according to the embodiment 7 is characterized in that in the embodiment 1, an undercoat film is formed on a substrate and another undercoat film having a porous layer is formed.

Figure 18:
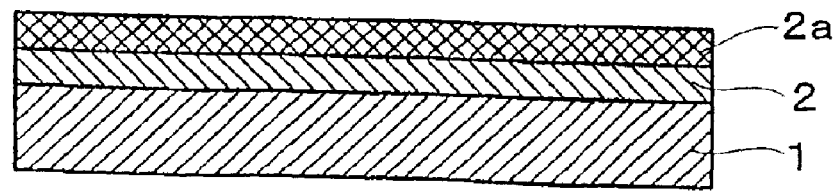
FIG. 18 is a sectional view showing a state wherein a second undercoat film having a porous layer is formed on a first undercoat film in the method of producing a semiconductor thin film as an embodiment 7 of the invention.

In the same manner as in the embodiment 1, an undercoat film 2 of $SiO_2$ having a thickness of 300 nm is formed on a substrate 1 by a TEOS-CVD method. Laser beams are applied to a film-forming silicon substrate as a target at an intensity at which silicon is vaporized. A silicon film is formed on the undercoat film 2 by laser ablation permitting vapor deposition of silicon particles. The obtained silicon film contains numerous empty apertures. Then, the silicon film is oxidized. Plasma is generated in an ozone or oxygen atmosphere, whereby the silicon film containing the empty apertures which is formed by laser ablation is oxidized to an SiO$_2$ film 2a (see FIG. 18). The SiO$_2$ film 2a has numerous empty apertures, which have an average diameter of 1 μm or less. Since the SiO$_2$ film 2a having empty apertures are unlikely to sufficiently prevent diffusion of glass or like dopants from the substrate 1 through the semiconductor layer, the diffusion of glass or like dopants from the substrate 1 through the semiconductor layer can be prevented without fail by provision of a 2-layer structure composed of the undercoat film 2 having a dense SiO$_2$ layer and the undercoat film 2a having a porous layer.

Thereafter a semiconductor thin film was produced in the same manner as in the embodiment 5. The size of the large size crystal 14 in the semiconductor thin film thus obtained was measured under an interatomic force microscope (ATFM) and a transmission electron microscope (TEM). It was found that a size a in a lengthwise direction was 30 μm and a size b in a widthwise direction was 0.5 μm (see FIGS. 6 and 7). A serious defect was not found in the crystal. The small size crystals 15 had a size of 200 μm or less.

Using the thus obtained semiconductor thin film, a semiconductor device, a liquid crystal display device and an EL display device were produced in the same manner as in the embodiment 1. In producing a TFT constituting the semiconductor device of this embodiment, an n-type TFT was obtained in the same manner as in the embodiment 5, the TFT having a channel length of 4 μm, an LDD length of 1.5 μm, and a source length and drain length, respectively of 10 μm. The areas continuously extend to form a single crystal which means the absence of grain boundary.

The TFT thus obtained exhibited a mobility of 380 cm$^2$/V·s and 97% or more of the initial mobility value after the resistance test, namely both good compared with the mobility of conventional TFT's.

The liquid crystal display device was 1.2% in percent defective of the driving circuit and 0.2% In percent defective in respect of irregularities in the luminance of image plane, namely both good compared with the levels in the conventional liquid crystal display device. The EL display device was 0.2% in percent defective in respect of irregularities in the luminance of image plane, and 0.5% in percent defective of the image quality, i.e., both good compared with the levels in the conventional EL display device.

The undercoat film having a porous layer can be a porous film such as a spin-on-glass (SOG) film. It was confirmed that a silicon crystal of large size grows in the porous film. SGO may be either organic or inorganic.

(Embodiment 8)

An embodiment 8 of the invention will be described. Methods of producing a semiconductor thin film according to the embodiments 8 to 12 are characterized in that in the method of producing a semiconductor thin film in the embodiment 1, the primary irradiation step is effected using an exposure mask.

First, an undercoat film 2 and an amorphous silicon film 3 are formed on a substrate 1 in the same manner as in the embodiment 1 (see FIG. 1). After dehydrogenation is carried out when required, a primary irradiation step is conducted as follows.

Figure 19:
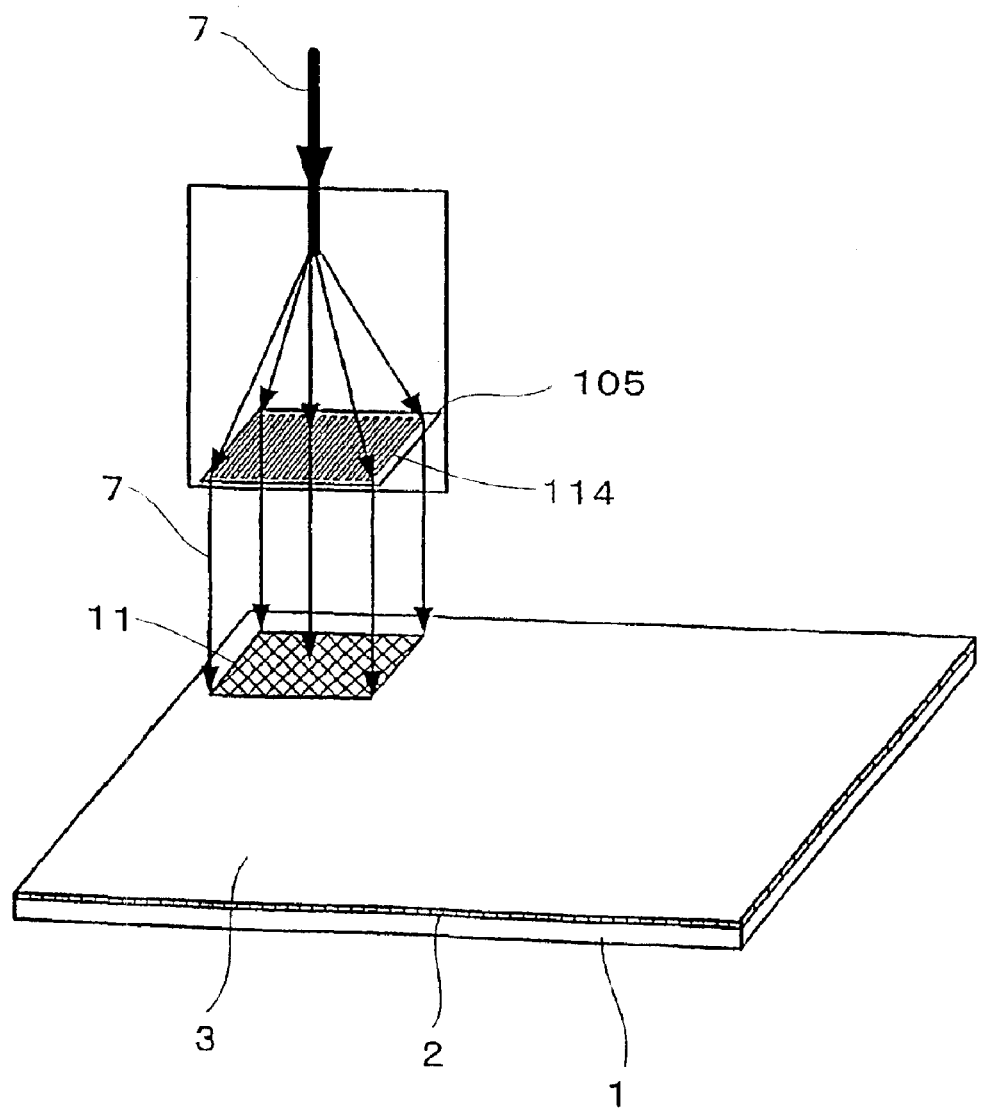
FIG. 19 is a perspective view showing a state wherein the primary irradiation step is being carried out using an exposure mask in the method of producing a semiconductor thin film as an embodiment 8 of the invention.

In this embodiment, an exposure mask 105 is used which comprises a plate and a plurality of lens 114 in the form of a strip in a plan view which are arranged on a plate in parallel with each other, as shown in FIG. 19. The plate constituting the exposure mask 105 may be made of either a light transmitting material or a light intercepting material. In this embodiment, quartz having a light transmitting property is used.

Figure 20:
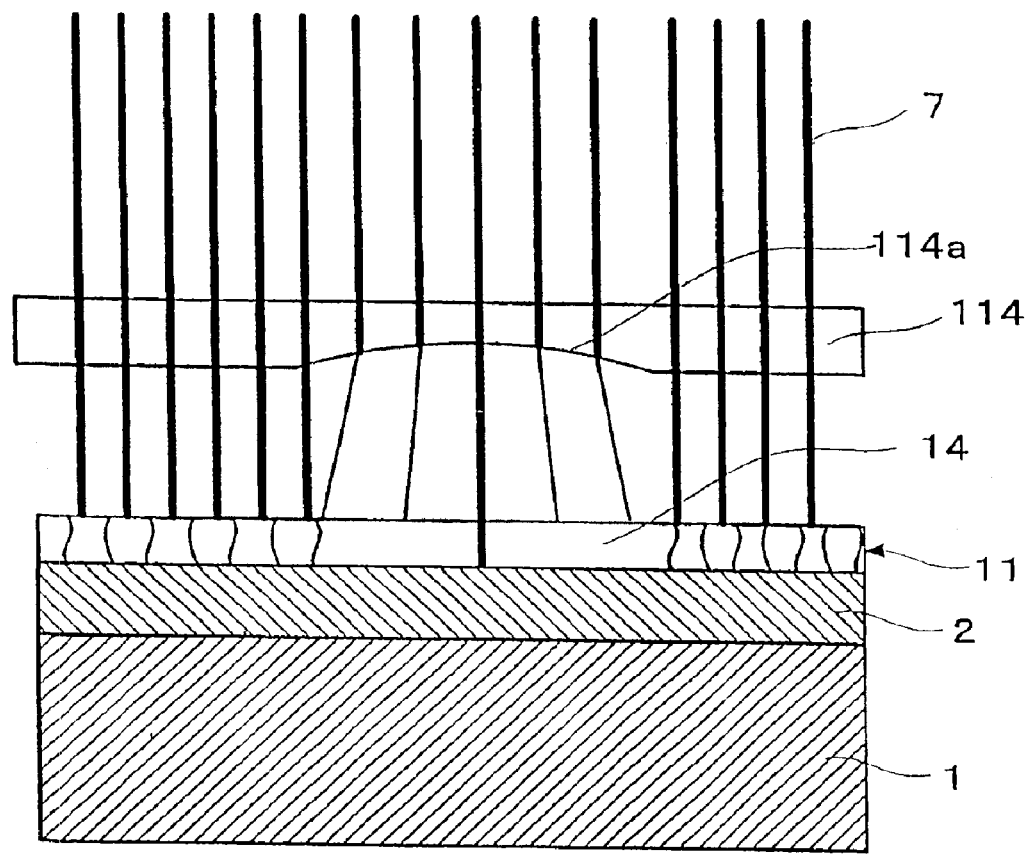
FIG. 20(a) is a sectional view schematically showing a state wherein a distribution of light quantity is established on a silicon film by the primary irradiation step using the exposure mask shown in FIG. 19.
FIG. 20(b) is a schematic view of the distribution of light quantity.
Figure 20:
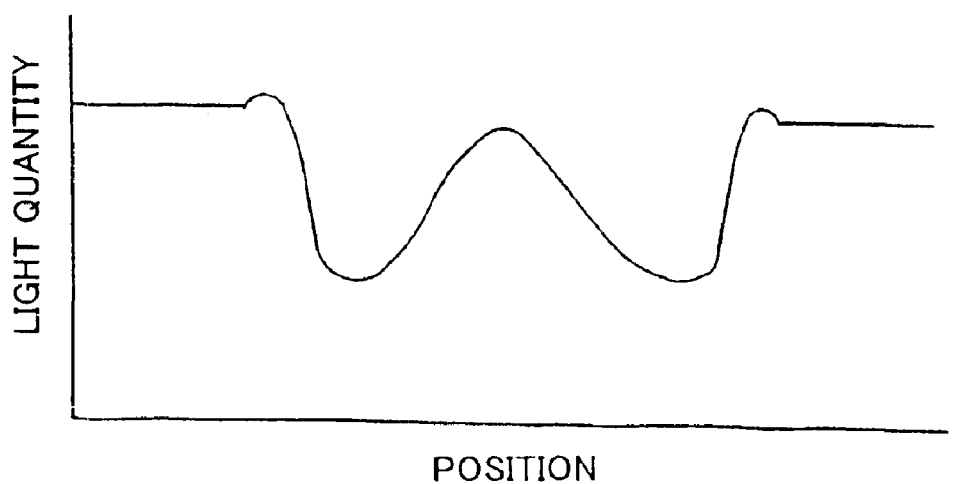

Each lens 114 is formed such that at a side face in a lengthwise direction as shown in FIG. 20(a), the underside (side opposed to the substrate 1) has a concave curved surface 114a in a circular-arc shape in a side view. The curvature is designed in consideration of locations of the substrate 1 and the exposure mask 105 so as to bring about an inclining distribution of light quantity passing through the lens 114 and applied to the silicon film.

The exposure mask 105 thus configured was disposed close to the substrate 1, and laser beams 7 were applied at one pulse via the exposure mask 105. The intensity of laser beams 7 is preferably in the same range as in the primary irradiation step of the embodiment 1, and was 380 mJ/cm$^2$ in this embodiment. Thereby laser beams 7 passing through the lens 114 brings about an inclining distribution of light quantity in a lengthwise direction of the lens 114 and an inclining temperature gradient in the same direction as the silicon film 11, as shown in FIG. 20(b). As a consequence, the crystal grows from the portions involving the smallest light quantity (two portions in FIG. 20(b)) toward the side of the center of the lens 114 and the side of periphery thereof, finally developing into a large size crystal 14. The size of the large size crystal 14 was measured under an interatomic force microscope (ATFM) and a transmission electron microscope (TEM). It was found that a size a in a lengthwise direction was 6 μm and a size b in a widthwise direction was 2 μm (see FIGS. 6 and 7). A serious defect was not found in the crystal 14. As described above, a large size silicon crystal 14 is formed in a position corresponding to the lens 114 of the exposure mask 105 in this embodiment. In this embodiment, the exposure mask 105 has a pattern for forming a key (not shown) by which an alignment key can be formed. A detailed description will be given later about the pattern for forming a key in an embodiment 10 to be described later.

Using the obtained semiconductor thin film, a semiconductor device, a liquid crystal display device and an EL display device were produced in the same manner as in the embodiment 1. In this embodiment, a TFT was formed in the position of the large size silicon crystal using the alignment key formed by the foregoing pattern for forming a key.

The TFT thus obtained exhibited a mobility of 170 cm$^2$/V·s and 75% or more of the initial mobility value after the resistance test, namely both good compared with the mobility of conventional TFT's. The liquid crystal display device was 11% in percent defective of the driving circuit and 5% in percent defective in respect of irregularities in the luminance of image plane, i.e., both good compared with the levels in the conventional liquid crystal display device. The EL display device was 5% in percent defective in respect of irregularities in the luminance of image plane, and 11% in percent defective of the image quality, namely both better than the levels in the conventional EL display device. The EL display device showed a luminance of 400 cd/m$^2$ in applying a voltage of 5V, namely improved compared with 300 cd/m$^2$ in the conventional EL display device.

In producing the semiconductor thin film of this embodiment, laser beams 7 were applied once. When laser beams 7 were applied several times (several pulses) to the substrate and the optical axis in a static state, namely in a fixed state of positional relation between them (static irradiation), the defects in the silicon crystal in the polycrystalline silicon film 11 were alleviated. Especially when laser beams were irradiated at 10 pulses or more (more preferably 100 pulses or more), not only the defects of silicon crystal were mitigated but also the size of crystal was extended and the performance of TFT produced was improved. When laser beams were applied at a plurality of pulses (scanning irradiation) such that the irradiation area became overlapped by 90% in each application of laser beams with the correlative positions of the substrate and optical axis gradually changed, the size of crystal was extended and the performance of TFT was improved by using the exposure mask 105 compared with conventional scanning irradiation although the defects of the crystal were not significantly mitigated compared with the foregoing static irradiation.

The lens 114 used in the exposure mask in this embodiment takes a concave shape. It is already confirmed that in the case of a convex lens, a suitable distribution of light quantity can be brought about as is the case with subsequent embodiments wherein an exposure mask having a lens is used.

(Embodiment 9)

Figure 21:
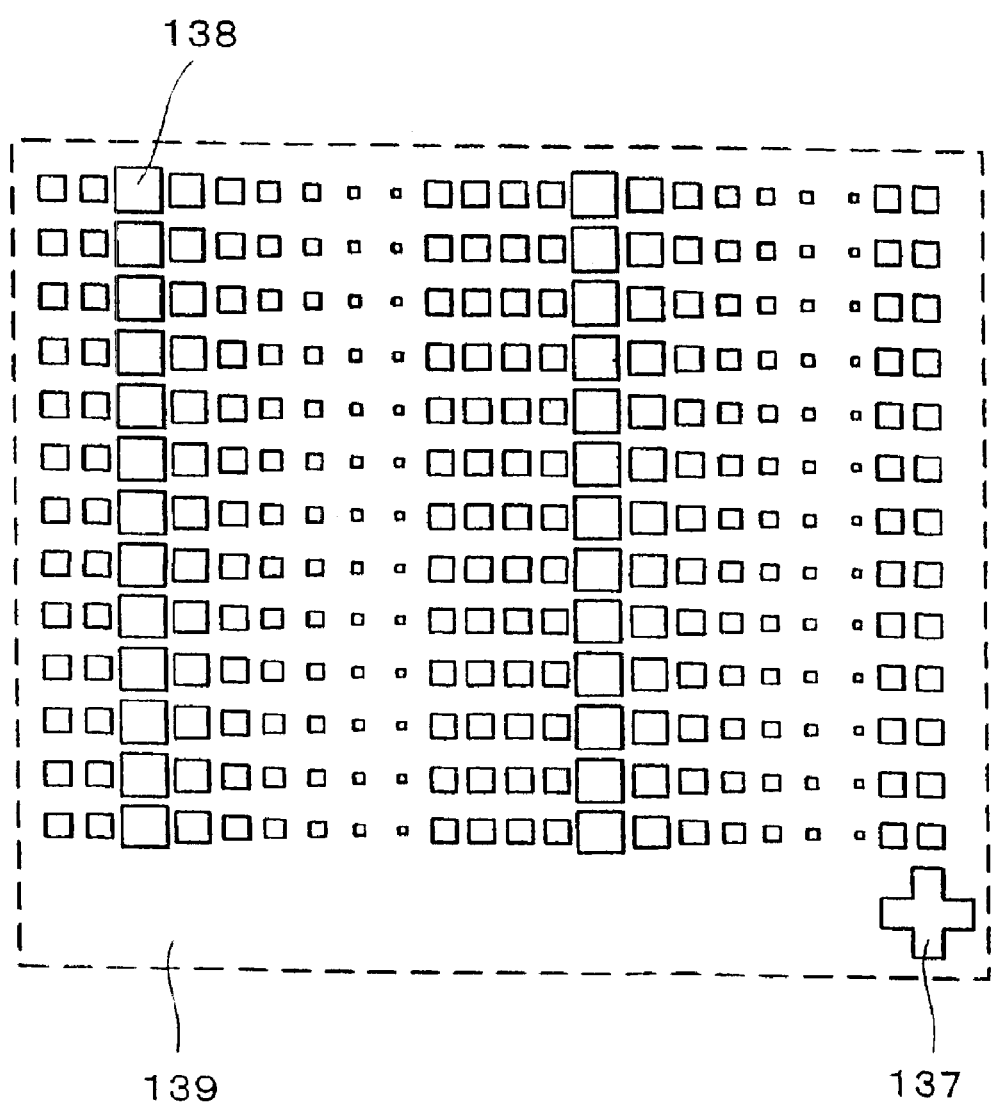
FIG. 21 is a plan view of the exposure mask to be used in the method of producing a semiconductor thin film as an embodiment 9 of the invention.

An embodiment 9 of the invention will be described. In a method of producing a semiconductor thin film according to the embodiment 9, an exposure mask 139 used comprises, as shown in FIG. 21, a plate made of a light-impermeable material (e.g. stainless steel) and a plurality of openings 138 formed therein. The openings 138 are arranged in a row in which the area of openings is stepwise changed. A plurality of such rows are laid while extending in parallel with each other. In other words, the rate of hole area is stepwise varied along a lengthwise direction of a strip region including this row. The rate of hole area may be varied, for example, by changing the shape of the opening 138 or a space.

The diameter of the opening 138 is designed such that a distribution of light quantity is established in the range of 250 mJ/cm$^2$ to 380 mJ/cm$^2$ in the case of irradiation of laser beams 7 to the substrate 1 at an intensity of 380 mJ/cm$^2$ via the exposure mask 139. Further, an opening 137 in a specified shape for forming a key pattern is formed in the exposure mask 139.

Figure 22:
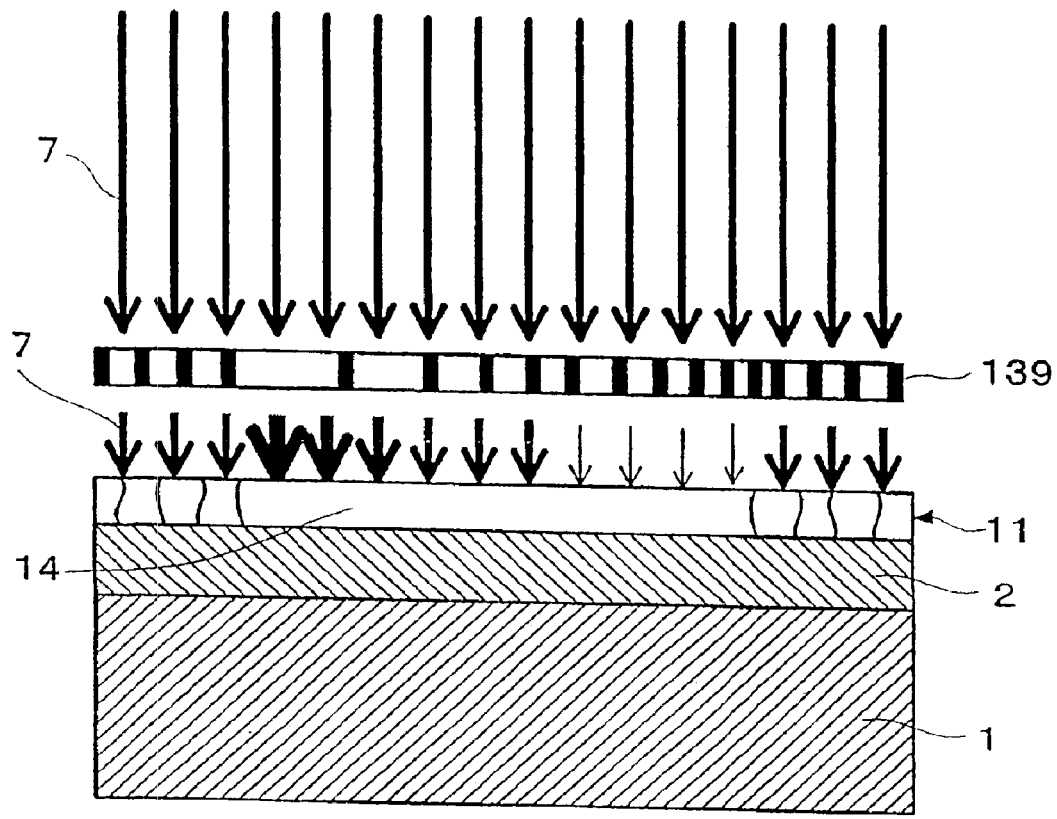
FIG. 22(a) is a sectional view schematically showing a state wherein a distribution of light quantity is established on a silicon film by the primary irradiation step using the exposure mask illustrated in FIG. 21
FIG. 22(b) is a diagram schematically showing the distribution of light quantity.
Figure 22:
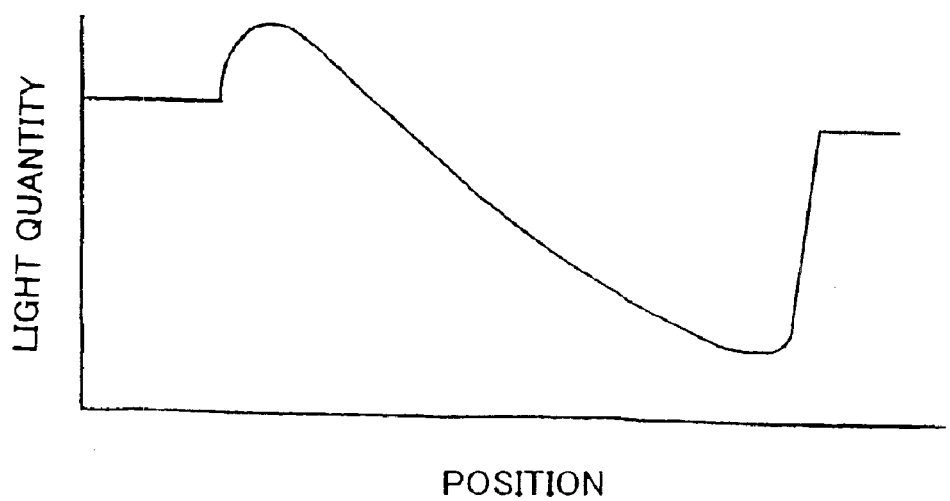

A semiconductor thin film was produced in the same manner as in the embodiment 8 with the above-configured exposure mask disposed in the vicinity of the substrate 1 (see FIG. 22(a)). Thereby laser beams 7 passing through the openings 138 of the exposure mask 139 are allowed to give rise to a distribution of light quantity along the row of openings and to bring about an inclining temperature gradient in the same direction as the silicon film 11, resulting in formation of a large size silicon crystal 14 from a low temperature portion to a high temperature portion. The size of the large size silicon crystal 14 was measured under an interatomic force microscope (ATFM) and a transmission electron microscope (TEM). It was found that a size a in a lengthwise direction was 10 µm and a size b in a widthwise direction was 3 µm (see FIGS. 6 and 7). A significant defect was not found in the crystal. The large size silicon crystal 14 is formed in a position corresponding to the row of openings 138 in the exposure mask 139.

In this embodiment, an opening 137 for forming a key pattern is formed in the exposure mask 139. A region of polycrystalline silicon film corresponding to the shape of the opening 137 is formed by irradiation of laser beams and the periphery thereof is a region of amorphous silicon film. Consequently the key pattern can be used as the alignment key 5 due to the difference of color between the polycrystalline silicon and amorphous silicon.

The alignment key 5 formed of an amorphous silicon film may be formed by producing an exposure mask wherein a key portion singly serves as a non-irradiation portion while the periphery thereof is irradiated with laser beams.

Using the obtained semiconductor thin film, a semiconductor device, a liquid crystal display device and an EL display device were produced in the same manner as in the embodiment 1. In producing a TFT constituting the semiconductor device, a TFT was formed in the position of the large size silicon crystal using the alignment key 5 in the same manner as in the embodiment 1.

The TFT thus obtained exhibited a mobility of 250 cm$^2$/V·s and 83% or more of the initial mobility value after the resistance test, namely both good compared with the mobility of conventional TFT's. The liquid crystal display device was 8% in percent defective of the driving circuit and 4% in percent defective in respect of irregularities in the luminance of image plane, namely both good compared with the levels in the conventional liquid crystal display device. The EL display device was 3% in percent defective in respect of irregularities in the luminance of image plane, and 8% in percent defective of the image quality, namely both good compared with the levels in the conventional EL display device. The EL display device showed a luminance of 450 cd/m$^2$ in applying a voltage of 5V, namely improved compared with the levels in the conventional EL display device.

(Embodiment 10)

Figure 23:
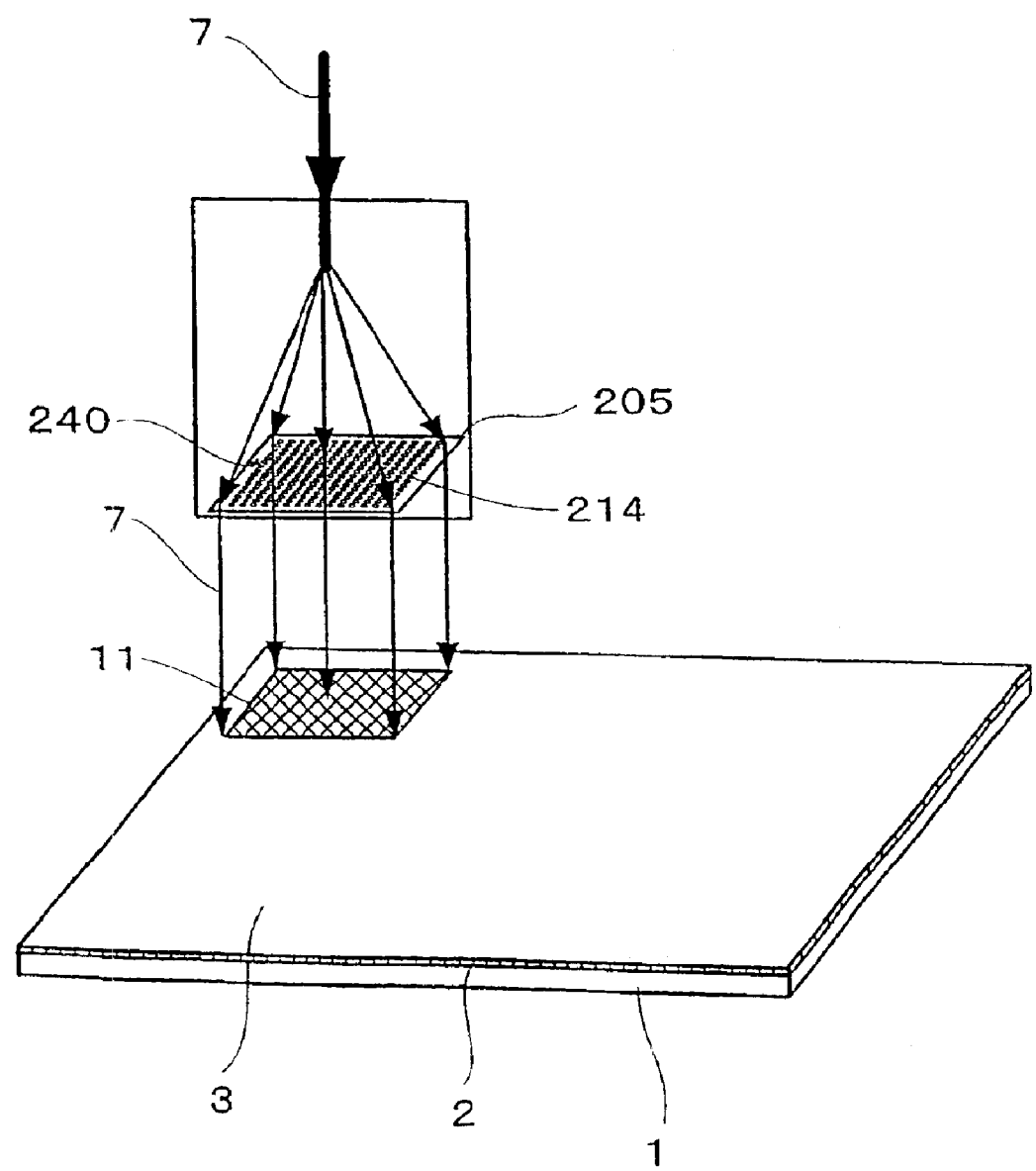
FIG. 23 is a perspective view showing a state wherein the primary irradiation step is being carried out using an exposure mask in the method of producing a semiconductor thin film as an embodiment 10 of the invention.

An embodiment 10 of the invention will be described. In a method of producing a semiconductor thin film according to the embodiment 10, an exposure mask 205 used comprises a plate and a plurality of lens 214 arranged in array (matrix) on the plate as shown in FIG. 23. The plate constituting the exposure mask 205 may be made of either a light-transmitting material or a light-intercepting material and was formed of quartz having a light-transmitting property in this embodiment.

Figure 24:
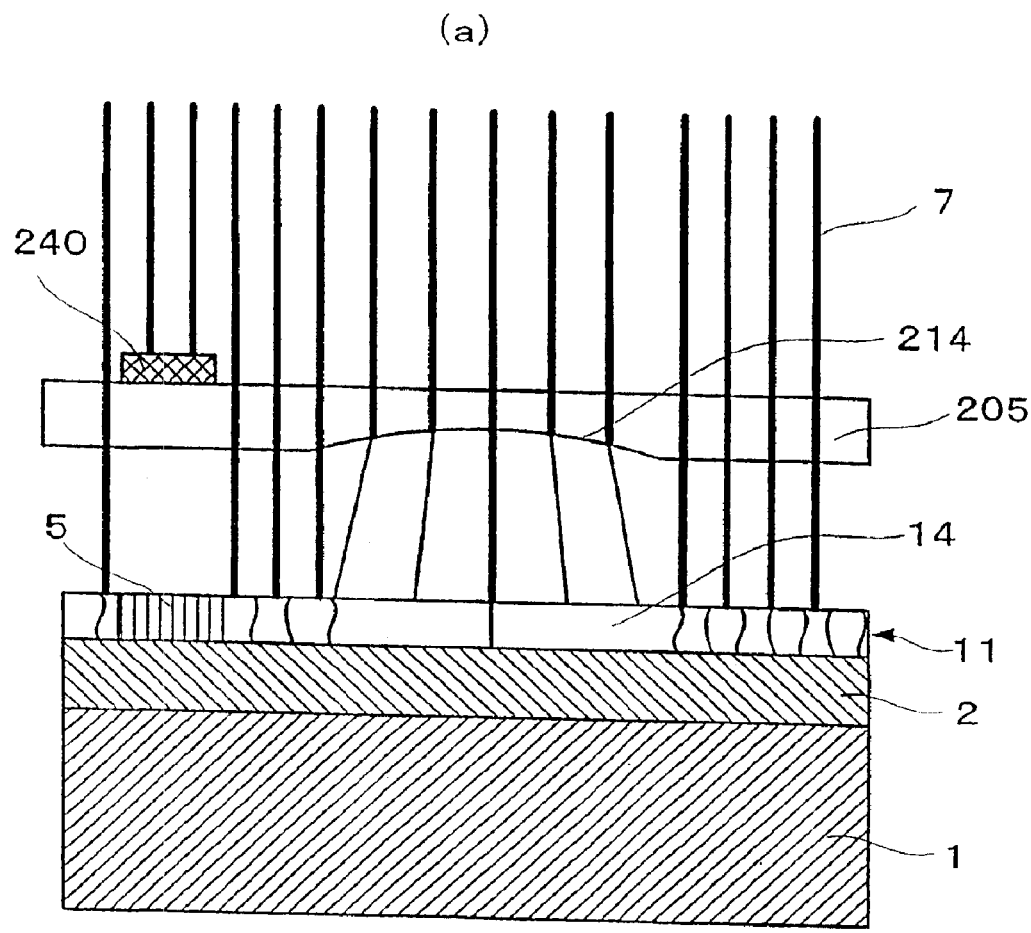
FIG. 24(a) is a sectional view schematically showing a state wherein a distribution of light quantity is established on a silicon film by the primary irradiation step using the exposure mask shown in FIG. 19
FIG. 24(b) is a diagram schematically showing the distribution of light quantity.
Figure 24:
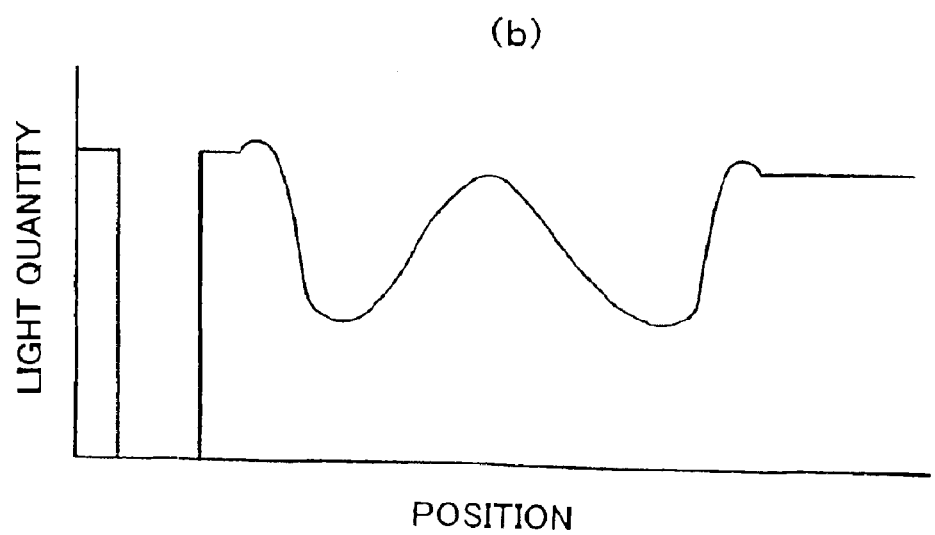
Figure 25:
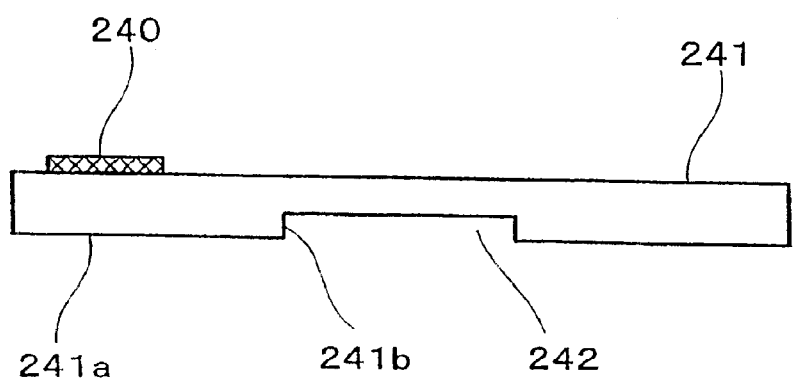
FIG. 25(a) is a side view of the exposure mask to be used in the method of producing a semiconductor thin film as an embodiment 11 of the invention.
FIG. 25(b) is a perspective view thereof.
Figure 25:
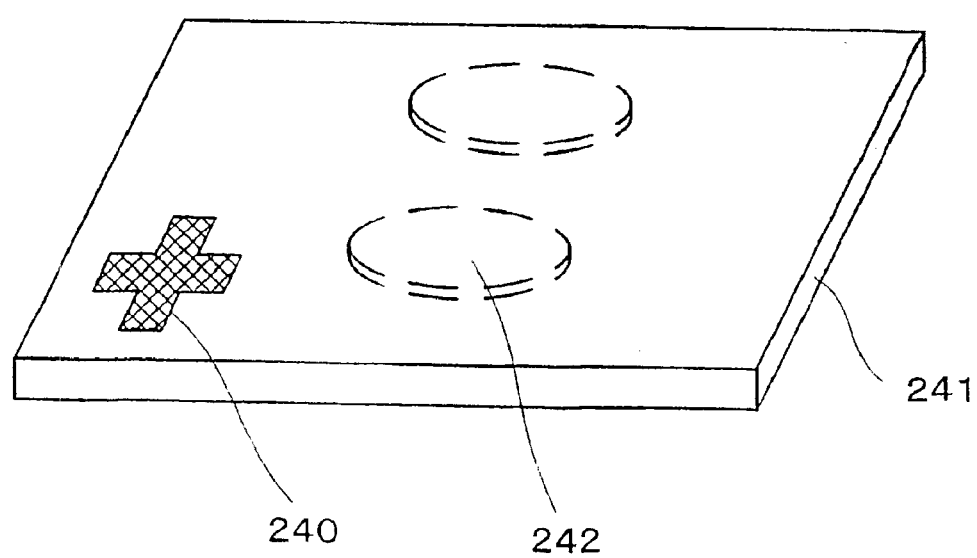

Each lens 214 is concave and has the underside (the side opposed to the substrate 1) in a concave form as shown in FIG. 24. The internal wall surface of the concave portion is substantially spherically shaped. The curvature of the lens is designed to give rise to an inclining distribution of light quantity irradiated to the substrate 1 via the exposure mask at an intensity in the range of 250 to 380 mJ/cm$^2$ when laser beams are applied at an intensity of 380 mJ/cm$^2$. Further a key-forming pattern 240 made of a metal or the like without a light-transmitting property is formed at a part of light-transmitting area of the exposure mask 205 (see FIG. 23).

The exposure mask 205 thus configured was disposed close to the substrate 1, and a semiconductor thin film was produced in the same manner as in the embodiment 8 (see FIG. 24(a)). Thereby laser beams 7 passing through the lens 214 of the exposure mask 205 are allowed, as shown in FIG. 24(b), to give rise to a distribution of light quantity along a direction of diameter of lens 214 in the shape of a circle in a plan view, and a large size silicon crystal is formed from a low temperature portion toward a high temperature portion. The size of the large size crystal 14 was measured under an interatomic force microscope (ATFM) and a transmission electron microscope (TEM). It was found that a size a in a lengthwise direction was 10 µm and a size b in a widthwise direction was 10 µm (see FIGS. 6 and 7). A serious defect was not found in the crystal 14. As described above, the distribution of light quantity was brought about also in a widthwise direction in this embodiment compared with the embodiment 8, so that the crystal was given a substantially circular shape, resulting in extended area of large size crystal 14.

In this embodiment, an amorphous silicon area is formed in a part of the polycrystalline silicon film 11 by the key-forming pattern 240 formed in the exposure mask 205 so that due to the difference between the polycrystalline silicon area formed in the periphery and the amorphous silicon area, the formed pattern can be used as the alignment key 5.

Using the obtained semiconductor thin film, a semiconductor device, a liquid crystal display device and an EL display device were produced in the same manner as in the embodiment 1. In producing a TFT constituting the semiconductor device, a TFT was formed in the position of the large size crystal 14 using the alignment key 5 in the same manner as in the embodiment 1. In this embodiment, the center of the large size crystal 14 substantially coincided with a position corresponding to the center of lens 214 of the exposure mask 205, so that the position of the formed large size crystal 14 became definite and constant. The large size crystal 14 and TFT can be more precisely positioned by the alignment key 5.

The thus obtained TFT exhibited a mobility of 370 cm$^2$/V·s and 95% or more of the initial mobility value after the resistance test, namely both good compared with the mobility of conventional TFT's. The liquid crystal display device was 3% in percent defective of the driving circuit and 1% in percent defective in respect of irregularities in the luminance of image plane, i.e., both good compared with the levels in the conventional liquid crystal display device. The EL display device was 1% in percent defective in respect of irregularities in the luminance of image plane, and 5% in percent defective of the image quality, namely both good compared with the levels in the conventional EL display device. The EL display device showed a luminance of 470 cd/m$^2$ in applying a voltage of 5V, namely improved compared with the levels in the conventional EL display device.

(Embodiment 11)

An embodiment 11 of the invention will be described. In a method of producing a semiconductor thin film according to the embodiment 11, an exposure mask 241 used comprises a plate made of a light-transmitting material (such as quartz) and a plurality of concave portions 242 formed in array on the underside of the plate (side opposed to the substrate). The internal wall of the concave portion 242 is formed in a cylindrical shape. A level difference 241b is formed between the underside 241a of the mask and the portion 242. A key-forming pattern 240 made of metal or the like without a light-transmitting property is formed in a part of the exposure mask 241.

Figure 26:
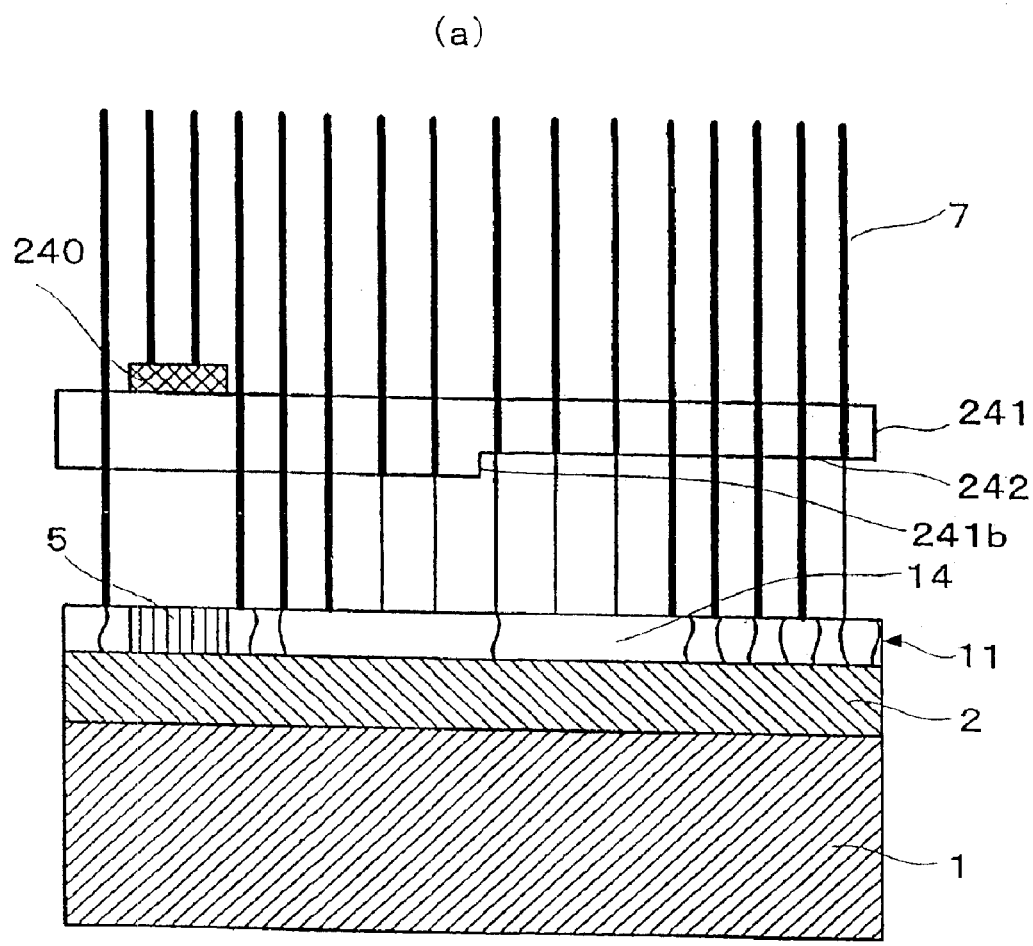
FIG. 26(a) is a sectional view schematically showing a state wherein a distribution of light quantity is established on a silica film by the primary irradiation step using the exposure mask shown in FIG. 25 and FIG. 26 (b) is a diagram schematically showing the distribution of light quantity.
Figure 26:
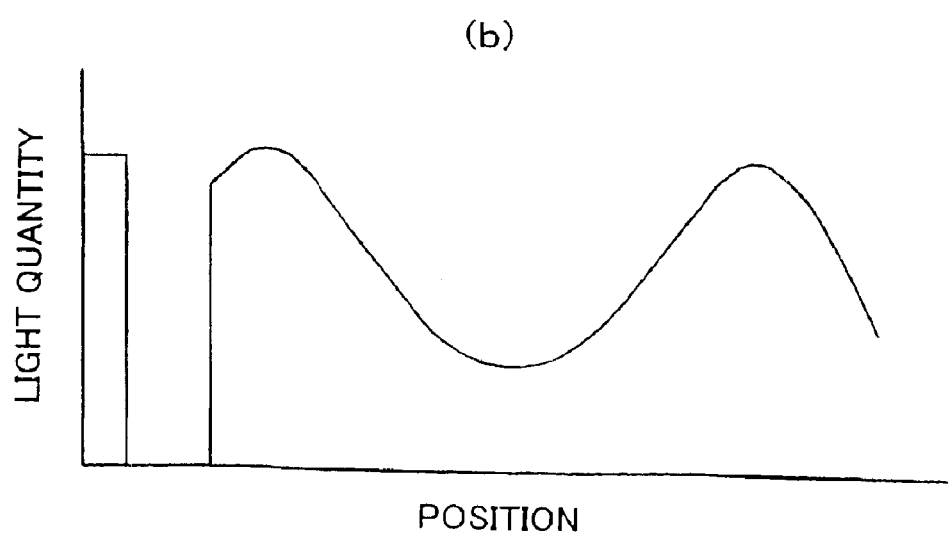

As shown in FIG. 26(a), the exposure mask 241 thus configured was disposed close to the substrate 1, and a semiconductor thin film was produced in the same manner as in the embodiment 8. Thereby laser beams 7 passing through the exposure mask 241 are allowed, as shown in FIG. 26(b), to give rise to a distribution of light quantity applied to the substrate because of phase shift occurring due to the level difference 241(b) in the concave portion 242. In the distribution of light quantity, the light quantity is the smallest in a position corresponding to the vicinity of the level difference 241b of the concave portion 242. The light quantity is increased toward the center side and the opposed side, respectively, along a diameter direction of concave portion 242. The size of the concave portion 242 and the height of the level difference 241b are designed to bring about an inclining distribution in the range of 250 mJ/cm$^2$ to 380 mJ/cm$^2$ in the case of irradiation at a laser intensity of 380 mJ/cm$^2$. Thereby a large size silicon crystal is formed toward a high temperature portion from a low temperature portion. In this embodiment, laser beams 7 passing through the exposure mask 241 are allowed to give rise to a phase difference distribution by forming a concave portion 242 on an underside 241a of the exposure mask 241, or optionally by forming a convex portion having a greater thickness than a peripheral portion.

The size of the large size crystal 14 was measured under an interatomic force microscope (ATFM) and a transmission electron microscope (TEM). It was found that a size a in a lengthwise direction was 10 μm and a size b in a widthwise direction was 10 μm (see FIGS. 6 and 7). A serious defect was not found in the crystal 14. As described above, a distribution of light quantity was brought about in a widthwise direction in this embodiment as in the embodiment 10, so that the crystalline shape became substantially circular, resulting in extended area of large size crystal 14.

In this embodiment, an amorphous silicon area is formed by the key-forming pattern 240 defined in the exposure mask 241 so that due to the difference between the polycrystalline silicon area formed on the periphery and the amorphous silicon area, the formed pattern can be used as the alignment key 5 (see FIG. 26(a)).

Using the obtained semiconductor thin film, a semiconductor device, a liquid crystal display device and an EL display device were produced in the same manner as in the embodiment 1. In producing a TFT constituting the semiconductor device, a TFT was produced in the position of the large size crystal using the alignment key 5 in the same manner as in the embodiment 1. In this embodiment, the center of the large size crystal 14 substantially coincided with the position corresponding to the center of the concave portion 242 of the exposure mask 241, so that the position of the formed large size crystal 14 becomes definite and constant. The large size crystal 14 and TFT can be more precisely positioned by the alignment key 5.

The thus obtained TFT exhibited a mobility of 410 cm$^2$/V·s and 97% or more of the initial mobility value after the resistance test, namely both good compared with the mobility of conventional TFT's. The liquid crystal display device was 2% in percent defective of the driving circuit and 0.7% in percent defective in respect of irregularities in the luminance of image plane, i.e., both good compared with the levels in the conventional liquid crystal display device. The EL display device was 0.6% in percent defective in respect of irregularities in the luminance of image plane, and 4% in percent defective of the image quality, namely both good compared with the levels in the conventional EL display device. The EL display device showed a luminance of 520 cd/m$^2$ in applying a voltage of 5V, namely improved compared with the levels in the conventional EL display device.

(Embodiment 12)

Figure 27:
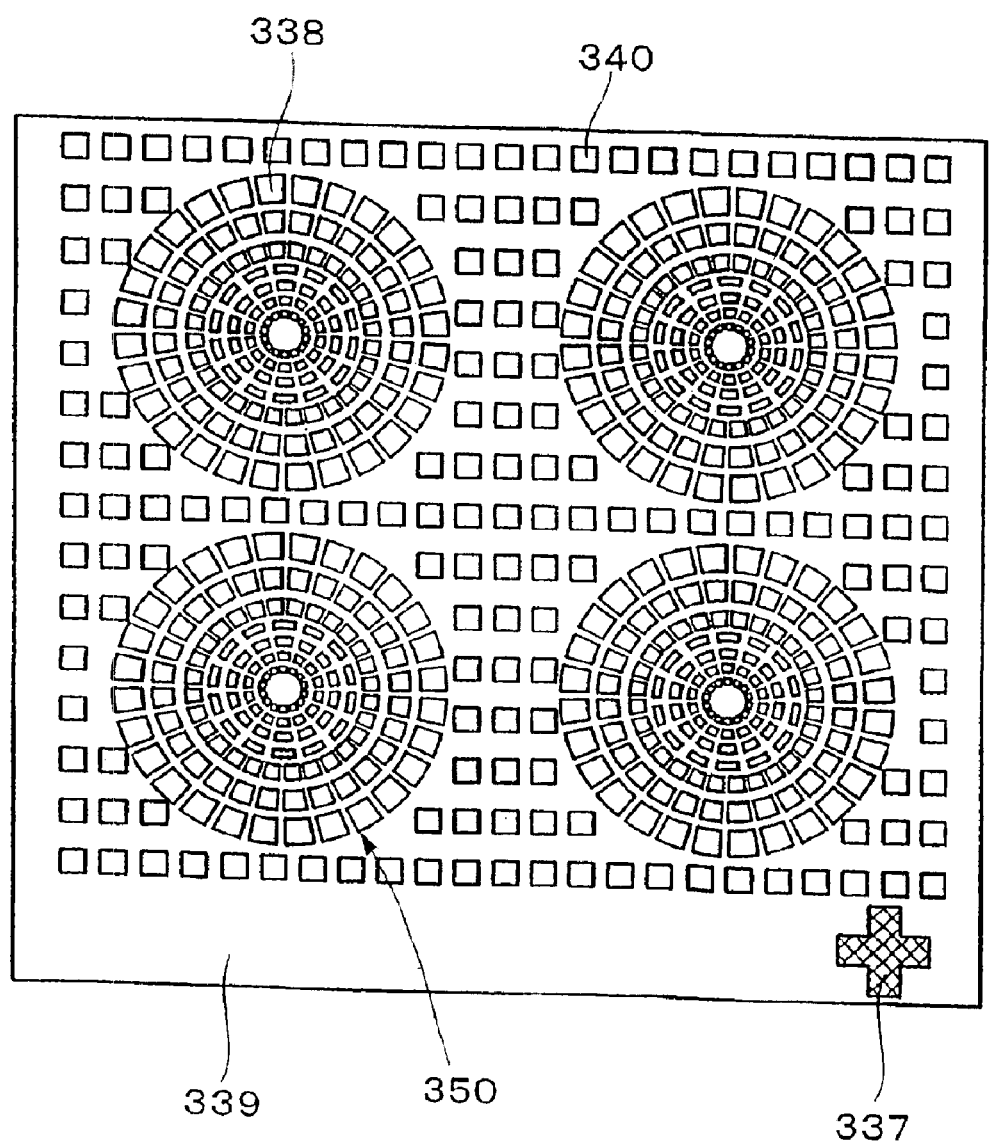
FIG. 27 is a plan view of the exposure mask to be used in the method of producing a semiconductor thin film as an embodiment 12 of the invention.

An embodiment 12 of the invention will be described. In a method of producing a semiconductor thin film according to the embodiment 12, an exposure mask 339 used comprises a plate made of a light-impermeable material (e.g. stainless steel) and a plurality of openings 338 formed therein as shown in FIG. 27. The openings 338 are arranged in a radial shape in a manner to stepwise increase the area of the individual openings 338, and forms a region 350, circular in a plan view, which is able to give rise to a distribution of light quantity. In the region 350, the openings 338 are arranged such that the rate of hole area per area unit is stepwise increased from the center toward the periphery in a diameter direction. The shape and space of the openings 338 are designed to give an inclining distribution of light quantity applied to the substrate 1 via the mask 339 at an intensity of 250 mJ/cm$^2$ to 380 mJ/cm$^2$ in the case of irradiation of laser beams at an intensity of 380 mJ/cm$^2$. The exposure mask 339 has a plurality of regions 350 set thereon in array (matrix) for bringing about the distribution of light quantity.

In a region other than the regions 350, the openings 340 each having the same area are arranged at equal intervals all over. Further an opening 337 in the specified shape is provided for forming a key pattern.

The exposure mask 339 thus configured was disposed close to the substrate 1, and a semiconductor thin film was produced in the same manner as in the embodiment 8. Laser beams passing through the openings 338 of the regions 350 give rise to a distribution of light quantity increasing from a position corresponding to the center of the region 350 on the substrate 1 toward the periphery thereof in a direction of diameter, giving an inclining temperature gradient, and resulting in formation of a large size silicon crystal 14 from a low temperature portion to a high temperature portion. The size of the large size crystal 14 was measured under an interatomic force microscope (ATFM) and a transmission electron microscope (TEM). It was found that a size a in a lengthwise direction was 10 μm and a size b in a widthwise direction was 10 μm (see FIGS. 6 and 7). A serious defect was not found in the crystal 14. As described above, a distribution of light quantity is established in a widthwise direction in this embodiment as in the embodiment 10, so that the crystal becomes substantially circular, resulting in extended area of large size crystal 14.

A portion, which was irradiated with laser beams via the openings 340 formed in a region other than the region 350, was made into small size crystals 15.

In this embodiment, a polycrystalline silicon area was formed in a position corresponding to the key-forming opening 337 by the key-forming opening 337 formed in the exposure mask 339. The irradiated laser beams were shut off by the exposure mask 339 in its periphery to form an amorphous silicon area. A pattern corresponding to the key-forming opening 337 can be used as the alignment key 5 due to the difference of color between the amorphous silicon area and polycrystalline silicon area.

Using the obtained semiconductor thin film, a semiconductor device, a liquid crystal display device and an EL display device were produced in the same manner as in the embodiment 1. In producing a TFT constituting the semiconductor device, a TFT was formed in the position of the large size crystal 14 using the alignment key 5 in the same manner as in the embodiment 1. In this embodiment, the center of the large size crystal 14 substantially coincided with the position corresponding to the center of the light quantity-distribution-forming region 350 in the exposure mask, so that the position of the formed large size crystal 14 became definite and constant. The large size crystal 14 and TFT can be more precisely positioned by the alignment key 5.

The thus obtained TFT exhibited a mobility of 410 $cm^2/V·s$ and 97% or more of the initial mobility value after the resistance test, namely both good compared with the mobility of conventional TFT's. The liquid crystal display device was 2% in percent defective of the driving circuit and 0.7% in percent defective in respect of irregularities in the luminance of image plane, i.e., both good compared with the levels in the conventional liquid crystal display device. The EL display device was 0.6% in percent defective in respect of Irregularities in the luminance of image plane, and 4% in percent defective of the image quality, i.e., both good compared with the levels in the conventional EL display device. The EL display device showed a luminance of 520 $cd/m^2$ in applying a voltage of 5V, namely improved compared with the levels in the conventional EL display device.
(Embodiment 13)

Figure 28:
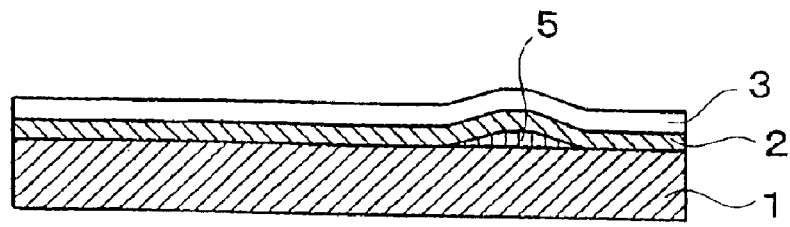
FIG. 28 is a sectional view for describing a step of producing a TFT constituting the semiconductor device in the method of producing a semiconductor device as an embodiment 13 of the present invention.
Figure 28:
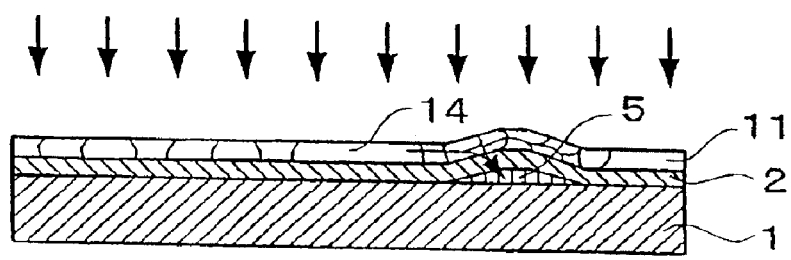
Figure 28:
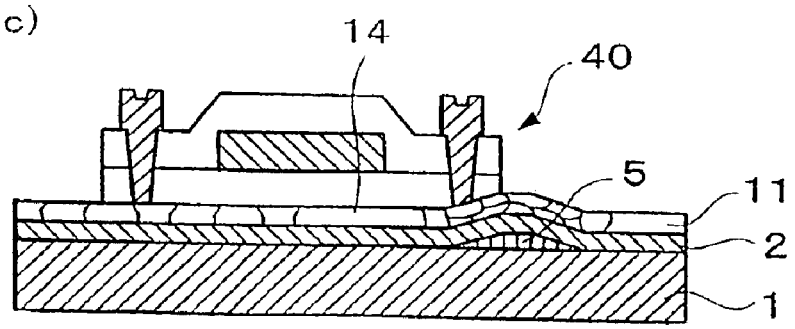
Figure 28:
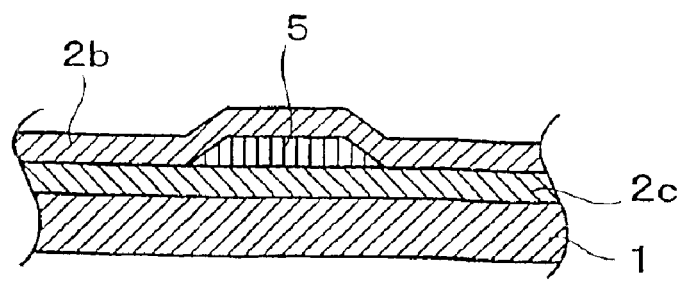

An embodiment 13 of the invention will be described. A method of producing a semiconductor thin film according to the embodiment 13 comprises, as shown in FIG. 28(a), the steps of forming an alignment key 5 on a substrate 1, forming an undercoat film 2 such as a nitride film or an oxide film on the substrate 1 and on the alignment key 5, and forming an amorphous silicon film 3 on the undercoat film 2. The alignment key 5 is made of a material higher in heat conductivity than the amorphous silicon film 3 and can be formed by methods in the preceding embodiments including vapor deposition using a mask, etching after forming the key 5, and forming the key 5 after forming a resist pattern, followed by lifting off.

Then, laser beams are applied to the amorphous silicon film 3 under the same conditions as the primary irradiation step in the embodiment 1. Thereby the alignment key 5 functions as the heat-dissipating layer as shown in FIG. 28(a), and a large size crystal 14 is formed in the vicinity of the alignment key 5.

Thereafter a TTF 40 can be formed in the position of the large size crystal 14 as shown in FIG. 28(c), using the alignment key 5 in the same manner as in the method of producing a TFT according to the embodiment 1. In this way, the alignment key 5 can also serve as the heat-dissipating layer, thereby contributing to simplification of the method of producing a semiconductor device.

The undercoat film 2 may be composed of two layers, i.e. an upper undercoat film 2b and a lower undercoat film 2c as shown in FIG. 28(d). Optionally the alignment key 5 may be formed between the upper undercoat film 2b and the lower undercoat film 2c. In this case, the upper undercoat film 2b may be preferably made thinner than the lower undercoat film 2c, thereby improving the heat conductivity. Moreover, the upper undercoat film 2b may be porous and the lower undercoat film 2c may be denser than the porous layer.
(Embodiment 14)

An embodiment 14 of the invention will be described. The structure of the TFT's in the above-described embodiments are generally called a coplanar structure or a positive stagger structure. Further, a bottom gate structure or a reverse stagger structure Is also available. A TFT with the reverse stagger structure can be produced as follows.

First, an alignment key 5 is formed on a substrate 1 and an undercoat film 2 is formed. Thereafter a metal film is formed by supttering and subjected to photolithography using an alignment key 5. A gate electrode 20 patterned in a specified position is formed by dry etching or the like (FIG. 29(a)). A gate insulating film 19 is formed by a TEOS-CVD method or the like. Then an amorphous silicon film 3 is formed by a plasma CVD method or the like. Dehydrogenation is conducted by heat treatment or the like (FIG. 29(b)).

Figure 29:
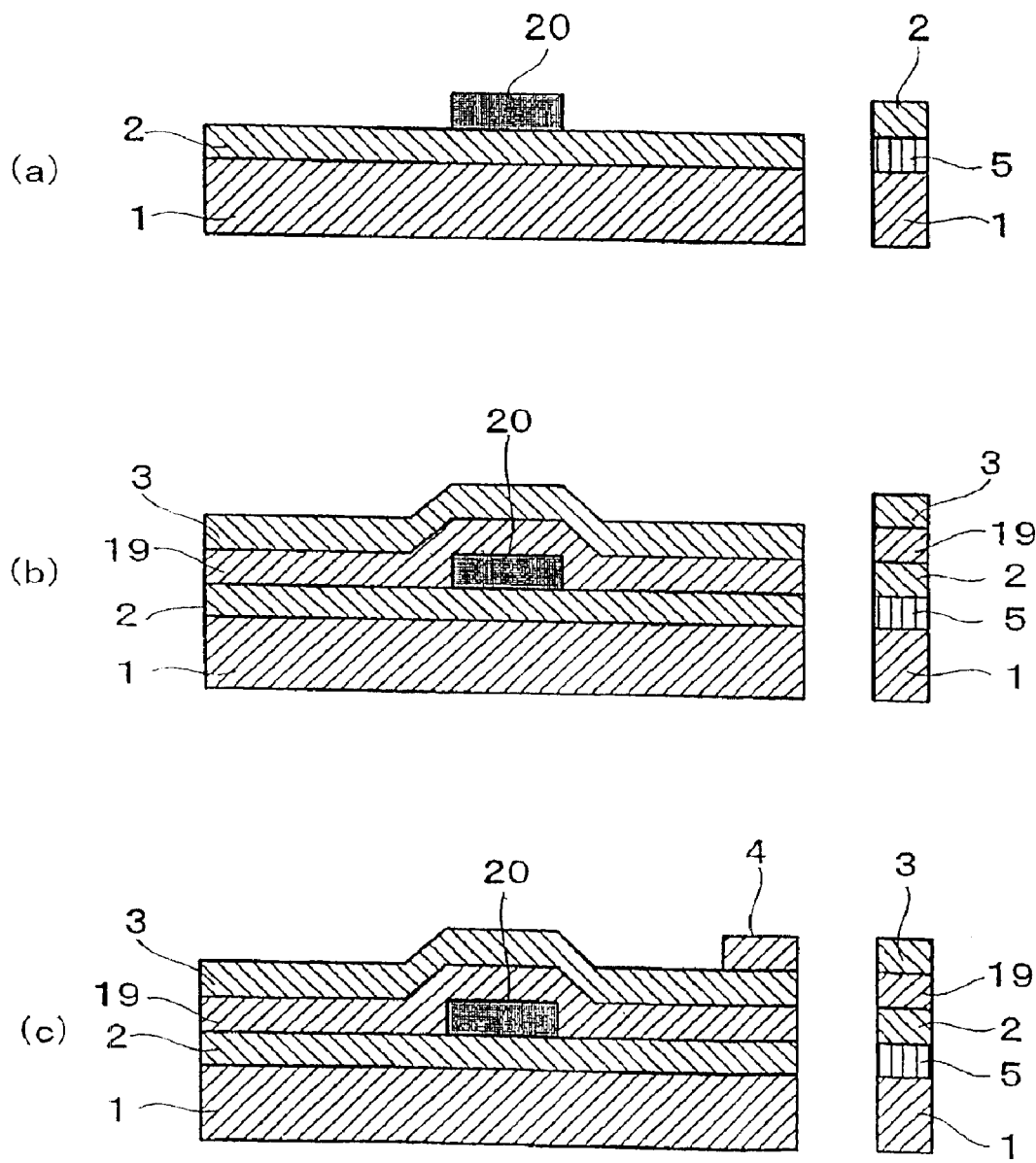
FIG. 29 is a sectional view for describing the step of producing a TFT constituting the semiconductor device in the method of producing a semiconductor device as an embodiment 14 of the present invention.
Figure 30:
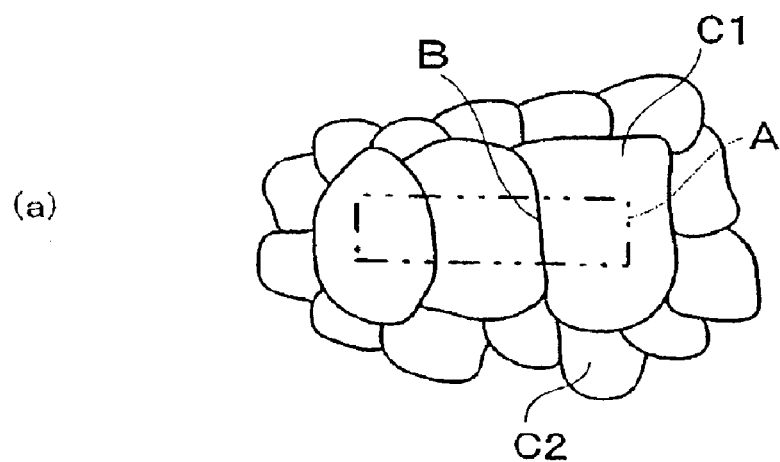
FIG. 30 shows, by way of example, a positional relationship between the LDD or offset area and the crystals in the semiconductor device of the invention.
Figure 30:
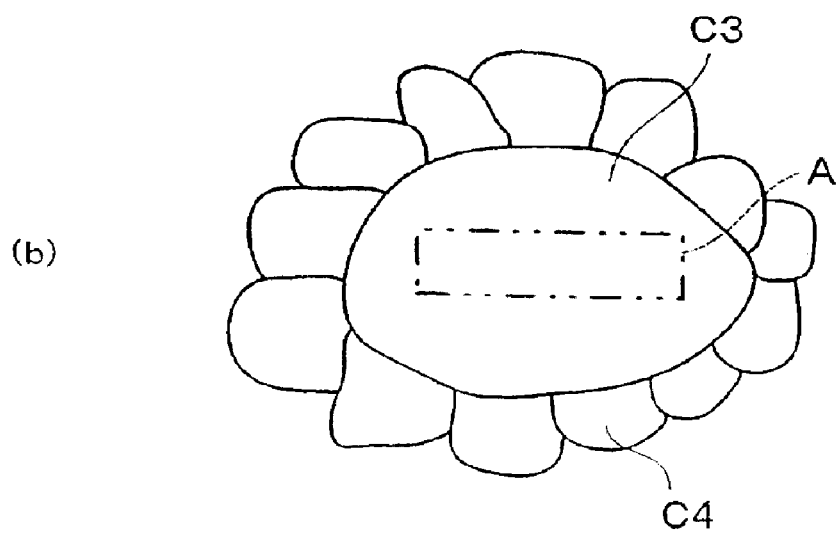
Figure 31:
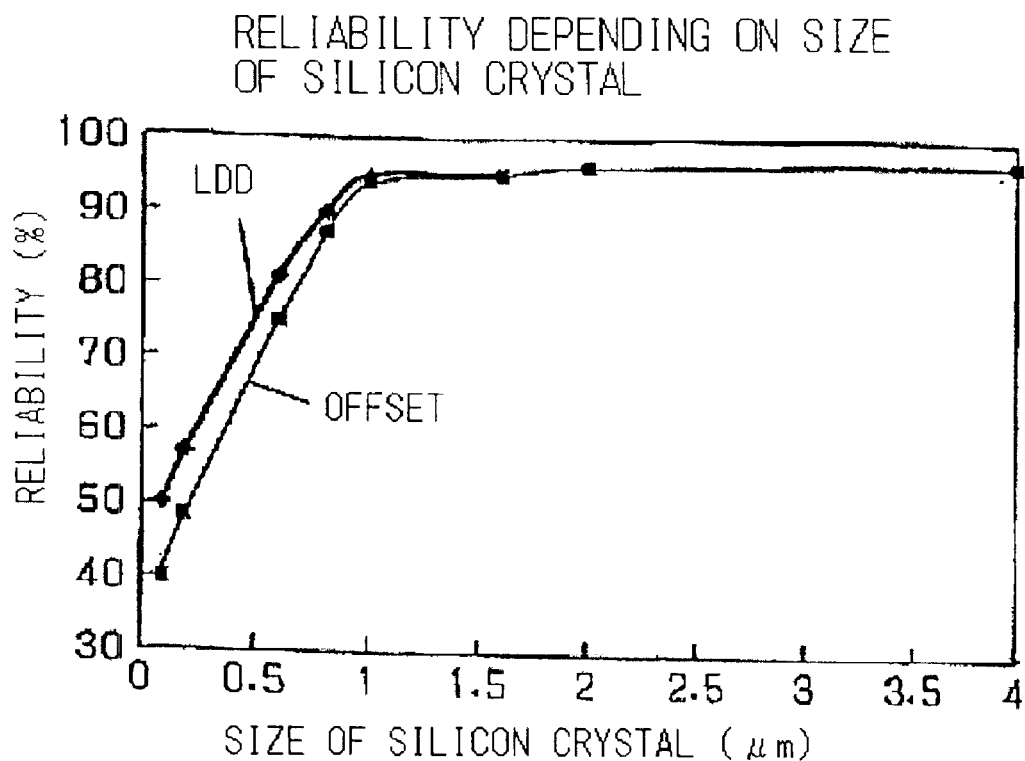
FIG. 31 is a diagram showing an interrelationship between the size of silicon crystal and the reliability of TFT.

Thereafter, using the amorphous silicon film 3 as the polycrystalline silicon film 11 in the same manner as in the embodiment 1 by a pre-irradiation step, a heat-dissipating layer 4 made of a material higher in heat conductivity than the polycrystalline silicon film 11 is formed in the vicinity of the gate electrode 20 (FIG. 29(c)). A large size crystal is formed in the vicinity of the heat-dissipating layer 4 by the primary irradiation step and the heat-dissipating layer 4 is removed, whereby a semiconductor thin film is completed. The heat-dissipating layer 4 can be formed, of course, by other methods set out in the foregoing embodiments. The method of producing a TFT using this semiconductor thin film can be carried out in the same manner as in the embodiment 1. The alignment key 5 can be formed together with the gate electrode 20 at the same time when a photo or etching procedure is conducted after forming a metal film for forming a gate electrode, instead of forming the alignment key 5 between the substrate 1 and the undercoat film 2.

The embodiments of the invention were described in detail. Nevertheless, it goes without saying that the invention is not limited to the foregoing embodiments and it can be variously modified without deviation from the scope of the invention.

What is claimed is:

1. A semiconductor device which is provided with a thin film transistor having a polycrystalline semiconductor layer, the semiconductor layer including a channel area, highly doped drain areas positioned on both sides of the channel area and LDD or offset areas positioned between the channel area and the highly doped drain areas, the LDD or offset areas being lower in dopant density than the highly doped drain areas or being free of dopant;

wherein any diameter of the crystal at least partly existing in the LDD or offset areas is larger than that of other crystals;

wherein the thin film transistor is formed in the vicinity of a pattern in a specified shape which is made of a material higher in heat conductivity than the semiconductor layer;

wherein the pattern is formed between the substrate and the semiconductor layer;

wherein the pattern is covered with an insulating undercoat film formed between the substrate and the semiconductor layer;

wherein the undercoat film includes an upper undercoat film and a lower undercoat film and the pattern is laid between the upper undercoat film and the lower undercoat film; and wherein the upper undercoat film is a porous layer and the lower undercoat film is denser than the porous layer.

2. The semiconductor device according to claim 1, wherein the upper undercoat film is thinner in thickness than the lower undercoat film.

3. A liquid crystal display device which is characterized in that the device has pixels which are operated by a supply of a voltage via the semiconductor device of claim 1.

4. An El display device which is characterized in that the device has pixels which are operated by a supply of a voltage via the semiconductor display device of claim 1.

5. A method of producing a semiconductor thin film which is characterized by comprising the step of irradiating an amorphous or polycrystalline semiconductor thin film formed on a substrate with high-intensity light rays or laser beams via an exposure mask to accomplish crystallization, wherein the exposure mask has a lens member with a curved face on at least a part of the top and underside surfaces, possesses a key-forming pattern made of a light-intercepting material and bring about an inclining distribution of light quantity applied to the semiconductor thin film, wherein the semiconductor thin film is crystallized by the step of applying high-intensity light rays or laser beams via the exposure mask to achieve crystallization, and wherein the alignment key comprising an amorphous or polycrystalline silicon area is formed along with crystallized semiconductor thin film.

6. The method according to claim 5, wherein the lens member is allowed to assume the form of a strip or a circle in a plan view, and wherein the distribution of light quantity is established in a lengthwise direction of the strip or a direction of diameter of the circular form.

7. The method according to claim 5, wherein the curved surface of the lens member is formed by depressing at least a part of the top and the back surfaces of the exposure mask.

8. A method of producing a semiconductor thin film which is characterized by comprising the step of applying high-intensity light rays or laser beams to an amorphous or polycrystalline semiconductor thin film formed on a substrate via an exposure mask to achieve crystallization, wherein the exposure mask is formed of a light-intercepting material having a plurality of openings by which an inclining distribution of light quantity applied to the semiconductor thin film is brought about, wherein the plurality of openings are arranged such that a rate of hole area per area unit is continuously varied along the lengthwise direction of the strip area, and wherein the distribution is brought about along the lengthwise direction.

9. A method of producing a semiconductor thin film which is characterized by comprising the step of applying high-intensity light rays or laser beams to an amorphous or polycrystalline semiconductor thin film formed on a substrate via an exposure mask to achieve crystallization, wherein the exposure mask is formed of a light-intercepting material having a plurality of openings by which an inclining distribution of light quantity applied to the semiconductor thin film is brought about, wherein the plurality of openings are arranged such that a rate of hole area per area unit is stepwise or continuously increased in a diameter direction from the center of the circular area toward the periphery of the circular area and wherein the distribution is brought about along the diameter direction.

10. A method of producing a semiconductor device which is characterized by comprising the steps of forming an alignment key on a part of a substrate, forming an amorphous or polycrystalline semiconductor thin film on the substrate and on the alignment key, irradiating the semiconductor thin film with high-intensity light rays or laser beams for crystallization, and forming a gate electrode film on the semiconductor thin film, wherein the alignment key is formed of a material higher in heat conductivity than the semiconductor thin film and wherein the alignment key functions as a heat-dissipating layer to form a large diameter crystal in its vicinity, and is used at least in a photo step for forming a pattern of the gate electrode at a specified position by etching a part of the gate electrode film.

11. A method of producing for producing a semiconductor device which is characterized by comprising the steps of applying high-intensity light rays or laser beams to an amorphous semiconductor thin film formed on a substrate via an exposure mask to accomplish crystallization in a state wherein a distribution of light quantity has been brought about, forming an amorphous alignment key according to the distribution of light quantity, and forming a gate electrode film on the semiconductor thin film, wherein there is a difference in color between the polycrystalline silicon area formed on the semiconductor thin film and an alignment key comprising an amorphous silicon area formed by shutting off a part of penetrating light rays with the exposure mask, and wherein the alignment key having a color different from the color of the polycrystalline silicon is used at least in a photo step for forming a pattern of the gate electrode at a specified position by etching a part of the gate electrode film.

12. A method for manufacturing a semiconductor device which is characterized by comprising the steps of forming a gate electrode and an alignment key on a part of a substrate, forming an amorphous or polycrystalline semiconductor thin film on the gate electrode and the alignment key, forming a heat-dissipating layer from a material higher in heat conductivity than the semiconductor thin film in a specified position of the semiconductor thin film using the alignment key and irradiating the semiconductor thin film with high-intensity light ray or laser beams for crystallization.

* * * * *